United States Patent
Yamazaki

(10) Patent No.: US 11,136,437 B2
(45) Date of Patent: Oct. 5, 2021

(54) CURABLE PARTICULATE SILICONE COMPOSITION, SEMICONDUCTOR MEMBER COMPRISING CURABLE PARTICULATE SILICONE COMPOSITION, AND METHOD FOR MOLDING SEMICONDUCTOR MEMBER

(71) Applicant: Dow Corning Toray Co., Ltd., Tokyo (JP)

(72) Inventor: Ryosuke Yamazaki, Ichihara (JP)

(73) Assignee: DOW TORAY CO., LTD., Tokyo (JP)

( * ) Notice: Subject to any disclaimer, the term of this patent is extended or adjusted under 35 U.S.C. 154(b) by 195 days.

(21) Appl. No.: 16/324,018

(22) PCT Filed: Aug. 4, 2017

(86) PCT No.: PCT/JP2017/028385
§ 371 (c)(1),
(2) Date: Feb. 7, 2019

(87) PCT Pub. No.: WO2018/030287
PCT Pub. Date: Feb. 15, 2018

(65) Prior Publication Data
US 2019/0177488 A1 Jun. 13, 2019

(30) Foreign Application Priority Data

Aug. 8, 2016 (JP) .............................. JP2016-155384

(51) Int. Cl.
| | | |
|---|---|---|
| *C08L 83/04* | (2006.01) | |
| *H01L 23/29* | (2006.01) | |
| *C08G 77/00* | (2006.01) | |
| *C08K 3/00* | (2018.01) | |
| *C08J 5/00* | (2006.01) | |
| *H01L 23/31* | (2006.01) | |
| *H01L 21/56* | (2006.01) | |
| *B29C 45/00* | (2006.01) | |
| *B29C 45/14* | (2006.01) | |
| *C08K 3/22* | (2006.01) | |
| *C08K 3/36* | (2006.01) | |
| *B29K 83/00* | (2006.01) | |
| *B29K 509/02* | (2006.01) | |
| *B29L 31/34* | (2006.01) | |

(52) U.S. Cl.
CPC .......... *C08G 77/80* (2013.01); *B29C 45/0001* (2013.01); *B29C 45/14639* (2013.01); *C08J 5/00* (2013.01); *C08K 3/00* (2013.01); *C08K 3/22* (2013.01); *C08K 3/36* (2013.01); *C08L 83/04* (2013.01); *H01L 21/56* (2013.01); *H01L 21/565* (2013.01); *H01L 23/29* (2013.01); *H01L 23/296* (2013.01); *H01L 23/31* (2013.01); *B29C 2045/0091* (2013.01); *B29K 2083/00* (2013.01); *B29K 2509/02* (2013.01); *B29K 2995/0005* (2013.01); *B29L 2031/3406* (2013.01); *C08K 2003/2227* (2013.01); *C08K 2003/2241* (2013.01); *C08K 2201/005* (2013.01); *C08K 2201/014* (2013.01)

(58) Field of Classification Search
CPC .............................. C08L 83/04; H01L 23/296
See application file for complete search history.

(56) References Cited

U.S. PATENT DOCUMENTS

| | | | |
|---|---|---|---|
| 3,974,122 A | 8/1976 | Sato et al. | |
| 8,933,158 B2 * | 1/2015 | Shiobara .................. | C08K 5/56 524/413 |
| 10,167,418 B2 | 1/2019 | Yamazaki et al. | |
| 2007/0293623 A1 | 12/2007 | Kashiwagi et al. | |
| 2008/0308828 A1 | 12/2008 | Kashiwagi et al. | |
| 2009/0171013 A1 | 7/2009 | Taguchi et al. | |
| 2013/0274398 A1 | 10/2013 | Shiobara et al. | |
| 2014/0288235 A1 | 9/2014 | Hirai et al. | |

(Continued)

FOREIGN PATENT DOCUMENTS

| | | |
|---|---|---|
| CN | 1879058 A | 12/2006 |
| CN | 104854176 A | 8/2015 |

(Continued)

OTHER PUBLICATIONS

English translation of International Search Report for Int. Appl. No PCT/JP2017/028385, dated Oct. 31, 2017, 2 pages.

(Continued)

*Primary Examiner* — Vickey Nerangis
(74) *Attorney, Agent, or Firm* — Warner Norcross + Judd LLP

(57) ABSTRACT

Provided is a curable particulate silicone composition that is hot-meltable, has excellent handling workability, curing properties, and gap fill properties when melted, and gives a cured product having excellent flexibility and resilience from room temperature to high temperatures of about 150° C. Also provided are pellets or the like formed by molding the curable particulate silicone composition. The curable particulate silicone composition comprises: (A) hot-meltable silicone particles that have a softening point of 30° C. or higher and have a hydrosilylatable group and/or a radical reactive group; (B) an inorganic filler (particulates) that is substantially free of coarse particles having an average particle diameter of 10.0 μm or larger; and (C) a curing agent. When cured, the composition gives a cured product having a storage modulus of 2000 Mpa or lower at 25° C. and of 100 Mpa or lower at 150° C.

12 Claims, No Drawings

(56) References Cited

U.S. PATENT DOCUMENTS

| | | |
|---|---|---|
| 2014/0377570 A1 | 12/2014 | Hirai et al. |
| 2015/0083324 A1 | 3/2015 | Stanjeck et al. |
| 2015/0183960 A1 | 7/2015 | Yamazaki et al. |
| 2015/0252221 A1 | 9/2015 | Iimura et al. |
| 2016/0032148 A1 | 2/2016 | Amako et al. |
| 2016/0207833 A1 | 7/2016 | Ostendorf et al. |
| 2017/0190911 A1 | 7/2017 | Iimura et al. |
| 2017/0355804 A1 | 12/2017 | Fujisawa et al. |
| 2018/0105692 A1 | 4/2018 | Imaizumi et al. |
| 2018/0208816 A1 | 7/2018 | Yamazaki et al. |
| 2019/0169398 A1 | 6/2019 | Yamazaki |
| 2019/0169435 A1 | 6/2019 | Yamazaki |
| 2020/0392335 A1 | 12/2020 | Yamazaki |

FOREIGN PATENT DOCUMENTS

| | | |
|---|---|---|
| CN | 110482912 A | 11/2019 |
| JP | 2007332259 A | 12/2007 |
| JP | 2008019424 A | 1/2008 |
| JP | 2009235368 A | 10/2009 |
| JP | 2013076050 A | 4/2013 |
| JP | 2013221075 A | 10/2013 |
| JP | 2014009322 A | 1/2014 |
| JP | 2014528488 A | 10/2014 |
| JP | 2016124967 A | 7/2016 |
| WO | 2005045525 A1 | 5/2005 |
| WO | 2013051600 A1 | 11/2013 |
| WO | 2014099639 A1 | 6/2014 |
| WO | 2014150841 A2 | 9/2014 |
| WO | 2015194158 A1 | 12/2015 |
| WO | 2016038836 A1 | 3/2016 |
| WO | 2016103654 A1 | 6/2016 |
| WO | 2016136243 A1 | 9/2016 |

OTHER PUBLICATIONS

Machine assisted English translation of WO2013051600A1 obtained from https://patents.google.com on Apr. 30, 2019, 37 pages.
Machine assisted English translation of JP2016124967A obtained from https://patents.google.com on Apr. 30, 2019, 20 pages.
Machine assisted English translation of WO2016038836A1 obtained from https://patents.google.com on Apr. 30, 2019, 23 pages.
Machine assisted English translation of JP2007332259A obtained from https://patents.google.com on Apr. 30, 2019, 17 pages.
Machine assisted English translation of JP2008019424A obtained from https://patents.google.com on Apr. 30, 2019, 11 pages.
English translation of International Search Report for Appl. No. PCT/JP2017/028384, dated Oct. 31, 2017, 2 pages.
English translation of International Search Report for Int. Appl. No PCT/JP2017/028386, dated Oct. 31, 2017, 2 pages.
English translation of International Search Report for PCT/JP2018/019573 dated Aug. 28, 2018, 2 pages.

\* cited by examiner ically silicone composition, and a pellet molded from the curable particulate silicone composition. The present invention also relates to curable particulate silicone composition or pellet, a cured product using a sheet, a method of molding the cured product, and a semiconductor device comprising the cured product.

CURABLE PARTICULATE SILICONE COMPOSITION, SEMICONDUCTOR MEMBER COMPRISING CURABLE PARTICULATE SILICONE COMPOSITION, AND METHOD FOR MOLDING SEMICONDUCTOR MEMBER

CROSS-REFERENCE TO RELATED APPLICATIONS

This application is the National Stage of International Application No. PCT/JP2017/028385 filed on 4 Aug. 2017, which claims priority to and all advantages of Japan Patent Appl. No. 2016-155384 filed on 8 Aug. 2016, the content of which is hereby incorporated by reference.

TECHNICAL FIELD

The present invention relates to a curable particulate silicone composition, and a pellet molded from the curable particulate silicone composition. The present invention also relates to curable particulate silicone composition or pellet, a cured product using a sheet, a method of molding the cured product, and a semiconductor device comprising the cured product.

BACKGROUND ART

The curable silicone composition is cured to form a cured product having excellent thermal resistance, cold resistance, electrical insulation properties, weatherability, water repellency, and transparency and therefore, has been used in a wide range of industrial fields. As compared to other organic materials, the above-mentioned cured product made of the curable silicone composition is resistant to discoloring and is hard to decline in the physical properties, which is suitable as a sealant for optical materials and semiconductor devices.

In Patent document 1 and Patent document 2, the applicants propose a hot-meltable curable particulate silicone composition and a reactive silicone composition. However, such cured products formed by curing the silicone composition may have unsatisfactory flexibility and resilience from room temperature to high temperatures of about 150° C.

In Patent document 3 and Patent document 4, the applicants propose liquid (paste-like) curable silicone compositions. However, these liquid or paste-like curable silicone compositions have poor handling workability, curing properties, and gap fill properties, as well as unsatisfactory flexibility and resilience from room temperature to high temperatures of about 150° C. In particular, such cured products may be disadvantageously warped or broken due to a lack of flexibility.

Patent document 5 and Patent document 6 disclose hot-meltable curable compositions using a mixed filler containing coarse particles. However, cured products formed of these hot-meltable curable compositions have an extreme high storage modulus at room temperature (for example, 5000 Mpa or higher in Patent document 5) and have poor flexibility, which makes them difficult to be applied to uses subjected to deformation and bending at room temperature.

PRIOR ART DOCUMENTS

Patent Documents

Patent Document 1: PCT/JP 2016/000959
Patent Document 2: JP 2014-009322 A
Patent Document 3: WO 2016/038836
Patent Document 4: JP 2013-076050 A
Patent Document 5: JP 2013-221075 A
Patent Document 6: WO 2013/051600

SUMMARY OF THE INVENTION

Problems to be Solved by the Invention

An object of the present invention is to provide a curable particulate silicone composition that is hot-meltable, has excellent handling workability, curing properties, and gap fill properties when melted, and gives a cured product having excellent flexibility and resilience from room temperature to high temperatures of about 150° C., and pellets and the like molded from the curable particulate silicone composition. Another object of the present invention is to provide a semiconductor device member formed of the curable particulate silicone composition and a cured product such as pellet, a semiconductor device having the cured product, and a method of molding the cured product.

Means for Solving the Problems

The curable silicone composition of the present invention contains:

(A) hot-meltable silicone particles that has a softening point of 30° C. or higher and has a hydrosilylatable group and/or a radical reactive group;

(B) an inorganic filler (particulates) that is substantially free of coarse particles having an average particle diameter of 10.0 μm or larger; and (C) a curing agent, wherein the curable particulate silicone composition, when cured, gives a cured object having a storage modulus (G') of 2000 Mpa or lower at 25° C., and of 100 Mpa or lower at 150° C.

Preferably, the component (B) is a filler that has no softening point or does not soften at the softening point of the component (A) or lower, and is substantially free of coarse particles having an average particle diameter of 5.0 μm or larger. In terms of functionality and physical properties of the cured product, it is preferred that the component (B) is a reinforcing filler, a white pigment, a thermal conductive filler, an electrical conductive filler, a phosphor, or a mixture of at least two types of them, and especially in terms of flexibility from room temperature to high temperatures, and high gap fill properties, it is more preferable that the component (B) contains an inorganic filler (b1) having an average particle diameter of 0.1 μm or lower, and an inorganic filler (b2) having an average particle diameter of 0.1 to 5.0 μm at a mass ratio of 1/99 to 50/50.

Preferably, the component (A) is a silicone particulate composed of resinoid organopolysiloxane ($A_1$), an organopolysiloxane cross-linked product ($A_2$) formed by partially cross linking at least one type of organopolysiloxane, a block copolymer ($A_3$) consisting of a resinoid organosiloxane block and a chain organosiloxane block, or at least two types of ($A_1$), ($A_2$), and ($A_3$). More preferably the component (A) is a completely-spherical silicone particulate having an average primary particle diameter of 1 to 10 μm, and 10 mol % or higher of the silicon-bonded organic groups in the component (A) is the aryl group. Such completely-spherical silicone particulate is preferably acquired by using a spray drier or the like.

The content of the component (B) is preferably within the range 10 to 2000 parts by mass, more preferably within the range 50 to 900 parts by mass, with respect to 100 parts by mass of the total of the component (A). The composition of the present invention is substantially free of coarse particles, and may suitably contain a large amount of the component (B) within the range of 50 percent by mass, 60 percent by mass, or 70 percent by mass of the entire composition.

The curable particulate silicone composition of the present invention is preferably in the shape of pellet or sheet.

The curable particulate silicone composition of the present invention is available in the form of cured product, and may be used as a member for semiconductor device.

The curable particulate silicone composition and the cured product thereof of the present invention may be used for a semiconductor device, and a sealing member, a light reflection member, and so on are formed of the cured product, to provide a power semiconductor device, an optical semiconductor device, and a semiconductor device mounted on a flexible circuit board. In particular, the curable particulate silicone composition of the present invention has excellent gap fill properties when melted, and the cured product has excellent flexibility and resilience from room temperature to high temperatures, suitably providing a semiconductor device in which semiconductor elements are collectively sealed by so-called mold underfilling or wafer molding, or a sealed semiconductor element substrate on which semiconductor elements are sealed with the present cured product on a flexible circuit board subjected to deformation (bending or the like).

A method of molding the curable particulate silicone composition includes at least the following steps.

(I) heating the curable particulate silicone composition according to any of claims 1 to 8 to the softening point of the component (A) or higher and melting the curable particulate silicone composition;

(II) injecting the curable silicone composition acquired in the step (I) into a mold or spreading the curable silicone composition acquired in the step (I) in a mold by clamping; and (III) curing the curable silicone composition injected in the step (II).

The above-mentioned molding method includes transfer molding, compression molding, or injection molding, and the curable particulate silicone composition of the present invention is preferably used as a molding material. Further, the curable particulate silicone composition of the present invention can be preferably used in the coating step of simultaneously preforming overmolding and underfilling of the semiconductor elements with the cured product. That is, the composition can be suitably used as the material for so-called mold underfilling, overmolding that covers the surface of the semiconductor wafer substrate mounting the semiconductor elements and fills the gap between the semiconductor elements, and wafer molding that collectively seal a relatively large wafer such as 8 or 12 inches.

Effects of the Invention

The curable particulate silicone composition of the present invention (including the composition in the shape of pellet, sheet, or so on) is hot-meltable, has excellent handling workability, curing properties, and gap fill properties when melted, and gives a cured product having excellent flexibility and resilience from room temperature to high temperatures of about 150° C. The cured product of the present invention is useful as a semiconductor device member, and can be efficiently made according to uses by using the molding method of the present invention.

MODE FOR CARRYING OUT THE INVENTION

Curable Particulate Silicone Composition

The curable particulate silicone composition of the present invention contains following components (A) to (C), and when cured, gives a cured product having flexibility from room temperature to high temperatures.

(A) a hot-meltable silicone particle that has a softening point of 30° C. or higher and has a hydrosilylatable group and/or a radical reactive group;

(B) an inorganic filler (particulates) that is substantially free of coarse particles having an average particle diameter of 10.0 μm or larger; and (C) a curing agent.

Each of the components and optional components of the composition will be described below. Note that, according to the present invention, unless otherwise specified, "average particle diameter" means a primary average particle diameter of the particulates.

The component (A) is a hot-meltable silicone particle that is curable by the (C) curing agent, has a softening point of 30° C. or higher, and contains a hydrosilylatable group and/or a radical reactive group, which adds the excellent hot-meltable properties to the present composition.

Examples of the hydrosilylatable group in the component (A) include alkenyl groups with 2 to 20 carbon atoms such as a vinyl group, an allyl group, a butenyl group, a pentenyl group, a hexenyl group, a heptenyl group, an octenyl group, a nonenyl group, a decenyl group, an undecenyl group, and a dodecenyl group, and silicon-bonded hydrogen atoms. The alkenyl group is preferable as the hydrosilylatable group. The alkenyl group may be straight chain or branched chain, and preferably the vinyl group or the hexenyl group. The component (A) has preferably at least two hydrosilylatable groups in one molecule.

Examples of a group bonded to silicon atoms other than the hydrosilylatable group in the component (A) include an alkyl group with 1 to 20 carbon atoms, a halogen-substituted alkyl group with 1 to 20 carbon atoms, an aryl group with 6 to 20 carbon atoms, a halogen-substituted aryl group with 6 to 20 carbon atoms, an aralkyl group with 7 to 20 carbon atoms, an alkoxy group, and a hydroxyl group. Specific examples include: alkyl groups such as a methyl group, an ethyl group, a propyl group, a butyl group, a pentyl group, a hexyl group, a heptyl group, an octyl group, a nonyl group, a decyl group, an undecyl group, and a dodecyl group; aryl groups such as a phenyl group, a tolyl group, a xylyl group, a naphthyl group, an anthracenyl group, a phenanthryl group, a pyrenyl group; aralkyl groups such as phenethyl group, phenylpropyl group; and groups obtained by substituting part or whole of hydrogen atoms bonded to these groups with halogen atoms such as chlorine atoms and bromine atoms; and alkoxy groups such as a methoxy group, an ethoxy group, and a propoxy group. Especially, the phenyl group and the hydroxyl group are preferable.

Examples of the radical reactive group in the component (A) include alkyl groups with 1 to 20 carbon atoms such as a methyl group, an ethyl group, a propyl group, a butyl group, a pentyl group, a hexyl group, a heptyl group, an octyl group, a nonyl group, a decyl group, an undecyl group, and a dodecyl group; alkenyl groups with 2 to 20 carbon atoms such as a vinyl group, an allyl group, a butenyl group, a pentenyl group, a hexenyl group, a heptenyl group, an octenyl group, a nonenyl group, a decenyl group, an undecenyl group, a dodecenyl group; acryl-containing groups such as a 3-acryloxypropyl group and a 4-acryloyloxybutyl group; methacryl-containing groups such as a 3-methacryloxypropyl group and a 4-methacryloxybutyl group; and silicon-bonded hydrogen atoms. The alkenyl group is preferable as the radical reaction group. The alkenyl group may be straight chain or branched chain, and preferably the vinyl group or the hexenyl group. The component (A) preferably has at least two radical reactive groups in one molecule.

Examples of a group bonded to silicon atoms other than the radical reactive group in the component (A) include a halogen-substituted alkyl group with 1 to 20 carbon atoms, an aryl group with 6 to 20 carbon atoms, a halogen-substituted aryl group with 6 to 20 carbon atoms, an aralkyl group with 7 to 20 carbon atoms, an alkoxy group, and a hydroxyl group, such as the above-mentioned groups. Especially, the phenyl group and the hydroxyl group are preferable. Specifically, 10 mol % or more of all organic groups in molecule in the component (A) is the aryl group, in particular, the phenyl group.

The component (A) itself is hot-meltable, and is cured by a below-mentioned (C) curing agent. Such component (A) is preferably a silicone particulate composed of:

($A_1$) resinoid organopolysiloxane;

($A_2$) an organopolysiloxane cross-linked product formed by partially cross-linking at least one type of organopolysiloxane;

($A_3$) a block copolymer consisting of a resinoid organosiloxane block and a chain organosiloxane block; or a mixture of at least two types of ($A_1$), ($A_2$), and ($A_3$).

Preferably, the component ($A_1$) is resinoid organopolysiloxane having a hydrosilylatable group and/or a radical reactive group, and is hot-meltable resinoid organopolysiloxane that has a lot of T units or Q units and the aryl group. Examples of such component ($A_1$) include MQ resin, MDQ resin, MTQ resin, MDTQ resin, TD resin, TQ resin, and TDQ resin composed of any combination of triorganosiloxy units (M units) (organo group is only methyl group, methyl group and vinyl group or phenyl group), diorganosiloxy units (D units) (organo group is only methyl group, methyl group and vinyl group or phenyl group), monoorganosiloxy units (T unit) (organo group is methyl group, vinyl group, or phenyl group), and siloxy units (Q unit). Preferably, the component ($A_1$) has at least two hydrosilylatable group and/or radical reactive group in molecule, and 10 mol % or more of all organic groups in the molecule is the aryl group, in particular, the phenyl group.

Since the component ($A_2$) is formed by cross-linking at least one type of organopolysiloxane, when cured with the (C) curing agent, a crack hardly occurs, reducing shrinkage on curing. The "cross-linking" described herein means bonding of the organopolysiloxane that is a raw material by hydrosilylation reaction, condensation reaction, radical reaction, high-energy ray reaction, and so on. Examples of the hydrosilylatable group and the radical reactive group (including a high-energy ray reactive group) are the above-mentioned groups and examples of the condensation reactive group include a hydroxyl group, an alkoxy group, and an acyloxy group.

The units constituting the component ($A_2$) component are not specifically limited, and may be siloxane units and silalkylene group-containing siloxane units. To add sufficient hardness and mechanical strength to the acquired cured product, it is preferable to include the resinoid polysiloxane unit and the chain polysiloxane unit in the same molecule. That is, the component ($A_2$) is preferably a cross-linked product of resinoid (resin-like) organopolysiloxane and chain (including straight chain or branched chain) organopolysiloxane. By introducing resinoid organopolysiloxane structure-chain organopolysiloxane structure into the component ($A_2$), the component ($A_2$) is highly hot-meltable, and the curing agent (C) achieves good curing properties.

The component ($A_2$) is acquired by either of:

(1) coupling of resinoid organopolysiloxane structure-chain organopolysiloxane structure in a molecule by alkylene bond via hydrosilylation reaction of organopolysiloxane having at least two alkenyl groups in one molecule and organopolysiloxane having at least two silicon-bonded hydrogen atoms in one molecule;

(2) coupling of resinoid organopolysiloxane structure-chain organopolysiloxane structure in a molecule by siloxane bond or alkylene bond via radical reaction of organic peroxide of at least two types of organopolysiloxane having at least two radical reactive groups in one molecule; or (3) coupling of resinoid organopolysiloxane structure-chain organopolysiloxane structure in a molecule by siloxane (—Si—O—Si—) bond via condensation reaction of at least two types of organopolysiloxane.

The component ($A_2$) has the structure in which an organopolysiloxane part of the resin structure-chain structure is coupled by alkylene bond or new siloxane bond, thereby largely improving the hot-melting properties.

In the above-mentioned (1) and (2), examples of the alkylene group included in the component ($A_2$) include alkenyl groups with 2 to 20 carbon atoms such as an ethylene group, a propylene group, a butylene group, a pentylene group, and a hexylene group, and these groups may be straight chain or branched chain, preferably the ethylene group and the hexylene group.

The cross-linked product of resinoid organopolysiloxane and chain (including straight chain or branched chain) organopolysiloxane is composed of, for example, following siloxane units and silalkylene group-containing siloxane units.

M unit: siloxane unit as expressed by $R^1R^2{}_2SiO_{1/2}$

D unit: siloxane unit as expressed by $R^1R^2SiO_{2/2}$ $R^3M/R^3D$ unit: at least one type of siloxane unit selected from silalkylene group-containing siloxane unit as expressed by $R^3{}_{1/2}R^2{}_2SiO_{1/2}$ and silalkylene group-containing siloxane unit as expressed by $R^3{}_{1/2}R^2SiO_{2/2}$, and T/Q unit: at least one type of siloxane unit selected from siloxane unit as expressed by $R^2SiO_{3/2}$ and siloxane unit expressed by $SiO_{4/2}$.

In the formula, $R^1$ independently represents an alkyl group with 1 to 20 carbon atoms, a halogen-substituted alkyl group with 1 to 20 carbon atoms, an alkenyl group with 2 to 20 carbon atoms, an aryl group with 6 to 20 carbon atoms, a halogen-substituted aryl group with 6 to 20 carbon atoms, or an aralkyl group with 7 to 20 carbon atoms, such as the above-mentioned groups. $R^1$ preferably represents a methyl group, a vinyl group, or a phenyl group. However, at least two $R^1$ in all siloxane units represent an alkenyl group.

In the formula, $R^2$ independently represents an alkyl group with 1 to 20 carbon atoms, a halogen-substituted alkyl group with 1 to 20 carbon atoms, an aryl group with 6 to 20 carbon atoms, a halogen-substituted aryl group with 6 to 20 carbon atoms, or an aralkyl group with 7 to 20 carbon atoms, such as the same groups as in $R^1$. $R^2$ preferably represents a methyl group or a phenyl group.

In the formula, $R^3$ represents straight chain or branched chain alkylene group with 2 to 20 carbon atoms bonded to silicon atoms in another siloxane unit. Examples of the alkylene group include the above-mentioned groups, and an ethylene group and a hexylene group are preferable.

The M unit is a siloxane unit constituting a terminal of ($A_2$) component, and the D unit is a siloxane unit constituting straight chain polysiloxane structure. Note that, the alkenyl group is preferably present on the M unit or D unit, in particular, the M unit. The $R^3$ M unit and the $R^3$ D unit are siloxane units that are bonded to silicon atoms in another siloxane unit by silalkylene bond, and bonded to silicon atoms in another siloxane unit via oxygen atoms. The T/Q unit is a branched siloxane unit giving resinoid structure to polysiloxane, and the component ($A_2$) preferably contains a siloxane unit expressed by $R^2SiO_{3/2}$ and/or a siloxane unit expressed by $SiO_{4/2}$. In particular, to improve the hot-melting properties of the component ($A_2$) and adjust the content of aryl group in the component ($A_2$) component, the component ($A_2$) preferably contains the siloxane unit as expressed by $R^2SiO_{3/2}$, and in particular, $R^2$ contains the siloxane unit that is the phenyl group.

$R^3M/R^3D$ unit is a characteristic structure of the ($A_2$) that cross-links silicon atoms via the alkylene group of $R^3$. Specifically, the $R^3M/R^3D$ unit is at least one type of siloxane unit selected from alkylene group-containing silane unit as expressed by $R^3_{1/2}R^2_2SiO_{1/2}$ and alkylene group-containing siloxane unit as expressed by $R^3_{1/2}R^2SiO_{2/2}$, and at least two of all siloxane units constituting the component ($A_2$) are preferably these alkylene group-containing siloxane units. The preferable bonding mode between siloxane units having the alkylene group of $R^3$ is as mentioned above, and the number of $R^3$ between two alkylene group-containing siloxane units represents as a valance "1/2" like oxygen in the M unit. Given that the number of $R^3$ is 1, at least one selected from siloxane structure units as expressed by $[O_{1/2}R^2_2SiR^3SiR^2_2O_{1/2}]$, $[O_{1/2}R^2_2SiR^3SiR^2O_{2/2}]$, and $[O_{2/2}R^2SiR^3SiR^2O_{2/2}]$ is contained in the component ($A_2$), and each oxygen atom (O) is bonded to the silicon atoms contained in the M, D, and T/Q units. With such configuration, the component ($A_2$) can design the chain polysiloxane structure formed of the D units and the structure having the resinoid polysiloxane structure containing the T/Q units relatively easily, and is extremely excellent in physical properties.

In the above-mentioned (1), the component ($A_2$) can be acquired by hydrosilylation reaction of organopolysiloxane having at least two alkenyl groups in one molecule and organopolysiloxane having at least two silicon-bonded hydrogen atoms in one molecule at a reaction ratio of [number of mols of alkenyl group]/[number of mols of silicon-bonded hydrogen atoms]>1.

In the above-mentioned (2), the component ($A_2$) can be acquired by radical reaction of at least two types of organopolysiloxane having at least two radical reactive groups in one molecule with an insufficient amount of organic peroxide for all radical reactive groups.

In the above-mentioned (1) and (2), ($A_2$) component is acquired by hydrosilylation reaction or radical reaction of organopolysiloxane having resinoid siloxane structure and organopolysiloxane having chain siloxane structure.

For example, the component ($A_2$) is organopolysiloxane acquired by reacting at least one type of resinoid organopolysiloxane that contains siloxane units as expressed by $R^2SiO_{3/2}$ (In the formula, $R^2$ represents the above-mentioned groups) and/or siloxane units as expressed by $SiO_{4/2}$ in the molecule (AR), and has an alkenyl group with 2 to 20 carbon atoms or silicon-bonded hydrogen atoms or radical reactive group, with at least one type of chain organopolysiloxane that contains siloxane units as expressed by $R^2_2SiO_{2/2}$ in the molecule (In the formula, $R^2$ represents the above-mentioned groups) in the molecule ($A^L$) and has a group hydrosilylation reactive or radical reactive with the component ($A^R$) which is an alkenyl group with 2 to 20 carbon atoms or silicon-bonded hydrogen atoms, at a ratio designed such that the hydrosilylatable group and/or the radical reactive group in the component ($A^R$) or the component ($A^L$) remains after reaction.

In the above-mentioned (1), when at least a part of the component ($A^R$) is resinoid organopolysiloxane having an alkenyl group with 2 to 20 carbon atoms, at least a part of the component ($A^L$) is preferably chain organopolysiloxane having silicon-bonded hydrogen atoms.

Similarly, when at least a part of the component ($A^R$) is resinoid organopolysiloxane having silicon-bonded hydrogen atoms, at least a part of the component ($A^L$) is preferably chain organopolysiloxane having an alkenyl group with 2 to 20 carbon atoms.

Such component ($A_2$) is preferably acquired by hydrosilylation reaction of a reactant of radical reaction of organopolysiloxane having at least two alkenyl groups with 2 to 20 carbon atoms in the molecule of the component ($a_1$): the component ($a_{1-1}$) and/or the component ($a_{1-2}$) with an organic peroxide, or the component ($a_1$), with ($a_2$) organohydrogenpolysiloxane, in the presence of a hydrosilylation catalyst, at a molar ratio 0.2 to 0.7 mol of silicon-bonded hydrogen atoms in the component ($a_2$) with respect to the alkenyl group with 2 to 20 carbon atoms contained in the component ($a_1$).

The component ($a_{1-1}$) is polysiloxane having a lot of branched units, and is organopolysiloxane having at least two silicon-bonded alkenyl groups in one molecule as expressed by the average unit formula:

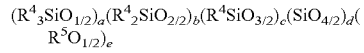

In the formula, $R^4$ independently represents an alkyl group with 1 to 20 carbon atoms, a halogen-substituted alkyl group with 1 to 20 carbon atoms, an alkenyl group with 2 to 20 carbon atoms, an aryl group with 6 to 20 carbon atoms, a halogen-substituted aryl group with 6 to 20 carbon atoms, or an aralkyl group with 7 to 20 carbon atoms, such as the same groups as in $R^1$. $R^4$ preferably represents a methyl group, a vinyl group, or a phenyl group. Note that at least two $R^4$ represents the alkenyl group. Due to good hot-meltable properties, 10 mol % or more, or 20 mol % or more of all $R^4$ is preferably the phenyl group. Furthermore, in the formula, $R^5$ represents a hydrogen atom or an alkyl group with 1 to 6 carbon atoms, such as the above-mentioned alkyl group.

In the formula, a is a number within the range of 0 to 0.7, b is a number within the range of 0 to 0.7, c is a number within the range of 0 to 0.9, d is a number within the range of 0 to 0.7, e is a number within the range of 0 to 0.1, c+d is a number within the range of 0.3 to 0.9, a+b+c+d is 1, preferably a is a number within the range of 0 to 0.6, b is a number within the range of 0 to 0.6, c is a number within the range of 0 to 0.9, d is a number within the range of 0 to 0.5, e is a number within the range of 0 to 0.05, c+d is a number within the range of 0.4 to 0.9, and a+b+c+d is 1. This is due the fact that, when a, b, and c+d each are within the above-mentioned range, the acquired cured product has excellent hardness and mechanical strength.

Such component ($a_{1-1}$) can be organopolysiloxanes as expressed as follows. In the formulae, Me, Ph, and Vi represent a methyl group, a phenyl group, and a vinyl group, respectively.

$(ViMe_2SiO_{1/2})_{0.25}(PhSiO_{3/2})_{0.75}(HO_{1/2})_{0.02}$ $(ViMe_2SiO_{1/2})_{0.25}(PhSiO_{3/2})_{0.75}$ $(ViMe_2SiO_{1/2})_{0.20}(PhSiO_{3/2})_{0.80}$ $(ViMe_2SiO_{1/2})_{0.15}(Me_3SiO_{1/2})_{0.38}(SiO_{4/2})_{0.47}(HO_{1/2})_{0.01}$ $(ViMe_2SiO_{1/2})_{0.13}(Me_3SiO_{1/2})_{0.45}(SiO_{4/2})_{0.42}(HO_{1/2})_{0.01}$ $(ViMe_2SiO_{1/2})_{0.15}(PhSiO_{3/2})_{0.85}(HO_{1/2})_{0.01}$ $(Me_2SiO_{2/2})_{0.15}(MeViSiO_{2/2})_{0.10}(PhSiO_{3/2})_{0.75}(HO_{1/2})_{0.04}$ $(MeViPhSiO_{1/2})_{0.20}(PhSiO_{3/2})_{0.80}(HO_{1/2})_{0.05}$ $(ViMe_2SiO_{1/2})_{0.15}(PhSiO_{3/2})_{0.75}(SiO_{4/2})_{0.10}(HO_{1/2})_{0.02}$ $(Ph_2SiO_{2/2})_{0.25}(MeViSiO_{2/2})_{0.30}(PhSiO_{3/2})_{0.45}(HO_{1/2})_{0.04}$ $(Me_3SiO_{1/2})_{0.20}(ViMePhSiO_{1/2})_{0.40}(SiO_{4/2})_{0.40}(HO_{1/2})_{0.08}$

The component ($a_{1-2}$) is polysiloxane having a lot of chain siloxane units, and is organopolysiloxane having at least two silicon-bonded alkenyl groups in one molecule as expressed by the average unit formula:

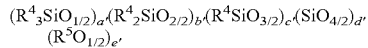

In the formula, $R^4$ and $R^5$ represent the above-mentioned groups.

In the formula, a' is a number within the range of 0.01 to 0.3, b' is a number within the range of 0.4 to 0.99, c' is a number within the range of 0 to 0.2, d' is a number within the range of 0 to 0.2, e' is a number within the range of 0 to 0.1, c'+d' is a number within the range of 0 to 0.2, a'+b'+c'+d' is 1, preferably a' is a number within the range of 0.02 to 0.20, b' is a number within the range of 0.6 to 0.99, c' is a number within the range of 0 to 0.1, d' is a number within the range of 0 to 0.1, j' is a number within the range of 0 to 0.05, c'+d' is a number within the range of 0 to 0.1, and a'+b'+c'+d' is 1. This is due to the fact that, when a', b', c', and d' each are within the above-mentioned range, the acquired cured product has improved resilience.

This type of component ($a_{1-2}$) can be organopolysiloxanes as expressed by follows. Note that, in the formulae, Me, Ph, and Vi represent a methyl group, a phenyl group, and a vinyl group, respectively.

$ViMe_2SiO(MePhSiO)_{18}SiMe_2Vi$, that is, $(ViMe_2SiO_{1/2})_{0.10}(MePhSiO_{2/2})_{0.90}$ $ViMe_2SiO(MePhSiO)_{30}SiMe_2Vi$, that is, $(ViMe_2SiO_{1/2})_{0.063}(MePhSiO_{2/2})_{0.937}$ $ViMe_2SiO(MePhSiO)_{150}SiMe_2Vi$, that is, $(ViMe_2SiO_{1/2})_{0.013}(MePhSiO_{2/2})_{0.987}$ $ViMe_2SiO(Me_2SiO)_{18}SiMe_2Vi$, that is, $(ViMe_2SiO_{1/2})_{0.10}(Me_2SiO_{2/2})_{0.90}$ $ViMe_2SiO(Me_2SiO)_{30}SiMe_2Vi$, that is, $(ViMe_2SiO_{1/2})_{0.063}(Me_2SiO_{2/2})_{0.937}$ $ViMe_2SiO(Me_2SiO)_{35}(MePhSiO)_{13}SiMe_2Vi$, that is, $(ViMe_2SiO_{1/2})_{0.04}(Me_2SiO_{2/2})_{0.70}(MePhSiO_{2/2})_{0.26}$ $ViMe_2SiO(Me_2SiO)_{10}SiMe_2Vi$, that is, $(ViMe_2SiO_{1/2})_{0.17}(Me_2SiO_{2/2})_{0.83}$ $(ViMe_2SiO_{1/2})_{0.10}(MePhSiO_{2/2})_{0.80}(PhSiO_{3/2})_{0.10}(HO_{1/2})_{0.02}$ $(ViMe_2SiO_{1/2})_{0.20}(MePhSiO_{2/2})_{0.70}(SiO_{4/2})_{0.10}(HO_{1/2})_{0.01}$ $HoMe_2SiO(MeViSiO)_{20}SiMe_2OH$ $Me_2ViSiO(MePhSiO)_{30}SiMe_2Vi$ $Me_2ViSiO(Me_2SiO)_{150}SiMe_2Vi$ The component ($a_{1-1}$) preferably enhances hardness and mechanical strength to the acquired cured product. The component ($a_{1-2}$) may be added as an optional component to enhance resilience to the acquired cured product and however, when a cross-linker having a lot of chain siloxane units is used in the component ($a_2$), the component ($a_2$) may be used in place of the component ($a_{1-2}$). In any case, the mass ratio of the component having a lot of branched siloxane units of the component having a lot of chain siloxane units is preferably within the range of 50:50 to 100:0 or within the range of 60:40 to 100:0. This is due to the fact that, when the mass ratio of the component having a lot of branched siloxane units to the component having a lot of chain siloxane units is within the above-mentioned range, the acquired cured product has excellent hardness and mechanical strength.

In the case of radical reaction of the component ($a_1$) with the organic peroxide, the component ($a_{1-1}$) may be reacted with the component ($a_{1-2}$) within the ratio of 10:90 to 90:10, and the component ($a_2$) may be omitted.

In hydrosilylation reaction, the component ($a_2$) is a component for cross-linking the component ($a_{1-1}$) and/or the component ($a_{1-2}$), and is organopolysiloxane having at least two silicon-bonded hydrogen atoms in one molecule. Examples of a group bonded to silicon atoms other than the radical reactive group in the component ($a_2$) include an alkyl group with 1 to 20 carbon atoms, halogen-substituted alkyl group with 1 to 20 carbon atoms, aryl group with 6 to 20 carbon atoms, halogen-substituted aryl group with 6 to 20 carbon atoms, aralkyl group with 7 to 20 carbon atoms, alkoxy group, an epoxy group-containing group, or a hydroxyl group, such as the above-mentioned groups.

While not limited thereto, the component ($a_2$) is preferably organohydrogenpolysiloxane as expressed by the average composition formula:

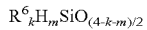

In the formula, $R^6$ represents an alkyl group with 1 to 20 carbon atoms, a halogen-substituted alkyl group with 1 to 20 carbon atoms, an aryl group with 6 to 20 carbon atoms, a halogen-substituted aryl group with 6 to 20 carbon atoms, or an aralkyl group with 7 to 20 carbon atoms, and examples include the same groups as in the $R^1$, preferably a methyl group or a phenyl group.

In the formula, k is a number within the range of 1.0 to 2.5, preferably a number within the range of 1.2 to 2.3, m is a number within the range of 0.01 to 0.9, preferably a number within the range of 0.05 to 0.8, and k+m is a number within the range of 1.5 to 3.0, preferably a number within the range of 2.0 to 2.7.

The component $(a_2)$ may be resinoid organohydrogenpolysiloxane having a lot of branched siloxane units, or chain organohydrogenpolysiloxane having a lot of chain siloxane units. Specifically, the component $(a_2)$ is organohydrogenpolysiloxane as expressed by the component $(a_{2-1})$, organohydrogenpolysiloxane as expressed by the component $(a_{2-2})$, or a mixture thereof.

The component $(a_{2-1})$ is resinoid organopolysiloxane having silicon-bonded hydrogen atoms as expressed by average unit formula:

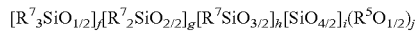

In the formula, $R^7$ independently represents an alkyl group with 1 to 20 carbon atoms, a halogen-substituted alkyl group with 1 to 20 carbon atoms, an aryl group with 6 to 20 carbon atoms, a halogen-substituted aryl group with 6 to 20 carbon atoms, an aralkyl group with 7 to 20 carbon atoms, or hydrogen atoms, and examples include the same groups as in $R^1$. Furthermore, in the formula, $R^5$ represents a hydrogen atom or an alkyl group with 1 to 6 carbon atom, such as the above-mentioned groups.

In the formula, f is a number within the range of 0 to 0.7, g is a number within the range of 0 to 0.7, h is a number within the range of 0 to 0.9, i is a number within the range of 0 to 0.7, j is a number within the range of 0 to 0.1, h+i is a number within the range of 0.3 to 0.9, f+g+h+i is 1. preferably f is a number within the range of 0 to 0.6, g is a number within the range of 0 to 0.6, h is a number within the range of 0 to 0.9, i is a number within the range of 0 to 0.5, j is a number within the range of 0 to 0.05, h+i is a number within the range of 0.4 to 0.9, and f+g+h+i is 1.

The component $(a_{2-2})$ is an organopolysiloxane having at least two silicon-bonded hydrogen atoms in one molecule as expressed by average unit formula:

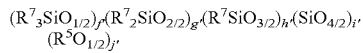

In the formula, $R^7$ and $R^5$ represent the above-mentioned groups.

In the formula, f' is a number within the range of 0.01 to 0.3, g' is a number within the range of 0.4 to 0.99, h' is a number within the range of 0 to 0.2, i' is a number within the range of 0 to 0.2, j' is a number within the range of 0 to 0.1, h'+i' is a number within the range of 0 to 0.2, f'+g'+h'+i' is 1, preferably f' is a number within the range of 0.02 to 0.20, g' is a number within the range of 0.6 to 0.99, h' is a number within the range of 0 to 0.1, i' is a number within the range of 0 to 0.1, j' is a number within the range of 0 to 0.05, h'+i' is a number within the range of 0 to 0.1, and f'+g'+h'+i' is 1.

As described above, since in the component $(a_2)$, resinoid organopolysiloxane having a lot of branched siloxane units enhances hardness and mechanical strength to the cured product, and organopolysiloxane having a lot of chain siloxane units enhances resilience to the cured product, it is preferable to appropriately use the component $(a_{2-1})$ and the component $(a_{2-2})$ as the component $(a_2)$. In detail, preferably when a small number of branched siloxane units are present in the component $(a_1)$, the $(a_{2-1})$ component is mainly used as the component $(a_2)$, and when a small number of chain siloxane units are present in the component $(a_1)$, the component $(a_{2-2})$ is mainly used. Preferably, the mass ratio of the component $(a_{2-1})$ to the component $(a_{2-2})$ in the component $(a_2)$ is within the range 50:50 to 100:0 or within the range 60:40 to 100:0.

For example, such component $(a_2)$ may be organopolysiloxanes as expressed by a following formulae. Note that in the formulae, Me and Ph represent a methyl group and a phenyl group, respectively.

$Ph_2Si(OSiMe_2H)_2$, that is, $Ph_{0.67}Me_{1.33}H_{0.67}SiO_{0.67}$ $HMe_2SiO(Me_2SiO)_{20}SiMe_2H$, that is, $Me_{2.00}H_{0.09}SiO_{0.95}$ $HMe_2SiO(Me_2SiO)_{55}SiMe_2H$, that is, $Me_{2.00}H_{0.04}SiO_{0.98}$ $PhSi(OSiMe_2H)_3$, that is, $Ph_{0.25}Me_{1.50}H_{0.75}SiO_{0.75}$ $(HMe_2SiO_{1/2})_{0.6}(PhSiO_{3/2})_{0.4}$, that is, $Ph_{0.40}Me_{1.20}H_{0.60}SiO_{0.90}$ The amount of the component $(a_2)$ is an amount where the silicon-bonded hydrogen atoms in the component $(a_2)$ has a molar ratio within a range of 0.2 to 0.7, preferably within a range of 0.3 to 0.6 with respect to the alkenyl group in the component $(a_1)$. This is due to the fact that, when the added amount of the component $(a_2)$ is within the above-mentioned range, the acquired cured product has excellent initial hardness and mechanical strength.

The organic peroxide used for radical reaction of the component $(a_1)$ is not specifically limited, and may be organic peroxide exemplified in the component (C). In radical reaction, the component $(a_1)$ is preferably a mixture of the component $(a_{1-1})$ and the component $(a_{1-2})$ at a mass ratio within the range 10:90 to 90:10. While not limited thereto, the content of the organic peroxide is preferably within the range 0.1 to 5 parts by mass, within the range 0.2 to 3 parts by mass, or within the range 0.2 to 1.5 parts by mass, with respect to 100 parts by mass of the component $(a_1)$.

A hydrosilylation catalyst used for hydrosilylation reaction of the component $(a_1)$ and the component $(a_2)$ is not specifically limited and may be a hydrosilylation catalyst exemplified in the component (C). Preferably, the added amount of the hydrosilylation catalyst is an amount where platinum-based metallic atoms in the hydrosilylation catalyst is within the range 0.01 to 500 ppm, within the range 0.01 to 100 ppm, or within the range 0.01 to 50 ppm in units of mass with respect to the total amount of the component $(a_1)$ and the component $(a_2)$.

The component $(A_3)$ is acquired by condensation reaction of a below-mentioned component $(a_3)$ and $(a_4)$ component by use of a condensation reaction catalyst.

The component $(a_3)$ is condensation reactive organopolysiloxane as expressed by the average unit formula:

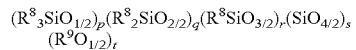

In the formula, $R^8$ independently represents alkyl group with 1 to 20 carbon atoms, a halogen-substituted alkyl group with 1 to 20 carbon atoms, an alkenyl group with 2 to 20 carbon atoms, an aryl group with 6 to 20 carbon atoms, a halogen-substituted aryl group with 6 to 20 carbon atoms, or an aralkyl group with 7 to 20 carbon atoms, such as the above-mentioned groups. In the formula, $R^9$ represents hydrogen atoms, an alkyl group with 1 to 6 carbon atoms, an acyl group with 2 to 5 carbon atoms; an alkoxy group such as a methoxy group and an ethoxy group; or an acyloxy group. The component $(a_3)$ has at least one silicon-bonded hydroxyl group, silicon-bonded alkoxy group, or silicon-bonded acyloxy group in one molecule. At least two $R^8$ in one molecule are the alkenyl group, and 10 mol % or more, or 20 mol % or more of all $R^8$ is preferably the phenyl group.

In the formula, p is a number within the range of 0 to 0.7, q is a number within the range of 0 to 0.7, r is a number within the range of 0 to 0.9, s is a number within the range of 0 to 0.7, t is a number within the range of 0.01 to 0.10, r+s is a number within the range of 0.3 to 0.9, p+q+r+s is 1, preferably p is a number within the range of 0 to 0.6, q is a number within the range of 0 to 0.6, r is a number within the range of 0 to 0.9, s is a number within the range of 0 to 0.5, t is a number within the range of 0.01 to 0.05, and r+s is a number within the range of 0.4 to 0.9. This is due to the fact that, when p, q, and r+s each are within the range the above-mentioned range, hot-meltable silicone that is non-fluid, has a low surface adhesiveness and a sufficiently low melting viscosity can be acquired while keeping flexibility at 25° C.

The component ($a_4$) is condensation reactive organopolysiloxane as expressed by the average unit formula:

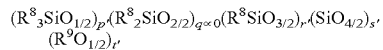

$$(R^8{}_3SiO_{1/2})_{p'}(R^8{}_2SiO_{2/2})_{q'\circ 0}(R^8SiO_{3/2})_{r'}(SiO_{4/2})_{s'}(R^9O_{1/2})_{t'}$$

In the formula, $R^8$ and $R^9$ represent the above-mentioned groups. The component ($a_4$) has at least one silicon-bonded hydroxyl group, silicon-bonded alkoxy group, or silicon-bonded acyloxy group in one molecule. In the formula, p' is a number within the range of 0.01 to 0.3, q' is a number within the range of 0.4 to 0.99, r' is a number within the range of 0 to 0.2, s' is a number within the range of 0 to 0.2, t' is a number within the range of 0 to 0.1, r'+s' is a number within the range of 0 to 0.2, p'+q'+r'+s' is 1, preferably p' is a number within the range of 0.02 to 0.20, q' is a number within the range of 0.6 to 0.99, r' is a number within the range of 0 to 0.1, s' is a number within the range of 0 to 0.1, t' is a number within the range of 0 to 0.05, and r'+s' is a number within the range of 0 to 0.1. This is due to the fact that, when p', q', r', and s' each are a number within the above-mentioned range, it is possible to acquire hot-meltable silicone that is non-fluid, and has a low surface tack and sufficient low melting viscosity at high temperatures while keeping flexibility at 25° C.

The condensation reaction catalyst for condensation reaction of the component ($a_3$) and the component ($a_4$) is not specifically limited, and examples thereof include organotin compounds such as dibutyltin dilaurate, dibutyltin diacetate, octenoic acid tin, dibutyltin dioctate, and lauric acid tin; organic titanium compounds such as tetrabutyl titanate, tetrapropyl titanate, and dibutoxybis (ethyl acetoacetate); acid compounds such as hydrochloric acid, sulfuric acid, and dodecylbenzenesulfonic acid; alkali compound such as ammonia and sodium hydroxide; amine-based compounds such as 1,8-diazabicyclo[5.4.0]undecene (DBU) and 1,4-diazabicyclo[2.2.2]octane (DABCO), preferably organotin compounds and organic titanium compounds.

The component ($A_3$) is a block copolymer consisting of a resinoid organosiloxane block and a chain organosiloxane block. Such component ($A_3$) is preferably composed of 40 to 90 mol % of disiloxy units as expressed by formula $[R^1{}_2SiO_{2/2}]$ and 10 to 60 mol % of trisiloxy units as expressed by $[R^1SiO_{3/2}]$, and contains 0.5 to 35 mol % of silanol group [≡SiOH]. Here, $R^1$ independently represents an alkyl group with 1 to 20 carbon atoms, a halogen-substituted alkyl group with 1 to 20 carbon atoms, an alkenyl group with 2 to 20 carbon atoms, an aryl group with 6 to 20 carbon atoms, a halogen-substituted aryl group with 6 to 20 carbon atoms, or an aralkyl group with 7 to 20 carbon atoms, such as the above-mentioned groups. At least two $R^1$ in one molecule represent the alkenyl group. The disiloxy units $[R^1{}_2SiO_{2/2}]$ form straight chain blocks having 100 to 300 disiloxy units per straight chain block in average, the trisiloxy units $[R^1SiO_{3/2}]$ form non-straight chain blocks having at molar amount of at least 500 g/mol, at least 30% of non-straight chain blocks are bonded to each other, each straight chain block is resinoid organosiloxane block copolymer that is bonded to at least one non-straight chain block by —Si—O—Si-bond, has a mass average molecular weight of at least 20000 g/mol, and contains 0.5 to 4.5 mol % of at least one alkenyl group.

The component ($A_3$) is prepared by condensation reaction of ($a_5$) resinoid organosiloxane or resinoid organosiloxane block copolymer, ($a_6$) chain organosiloxane, and as necessary, ($a_7$) siloxane compound.

The component ($a_5$) is resinoid organopolysiloxane as expressed by the average unit formula:

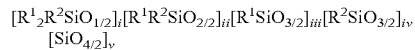

$$[R^1{}_2R^2SiO_{1/2}]_i[R^1R^2SiO_{2/2}]_{ii}[R^1SiO_{3/2}]_{iii}[R^2SiO_{3/2}]_{iv}[SiO_{4/2}]_v$$

In the formula, $R^1$ independently represents an alkyl group with 1 to 20 carbon atoms, a halogen-substituted alkyl group with 1 to 20 carbon atoms, an alkenyl group with 2 to 20 carbon atoms, an aryl group with 6 to 20 carbon atoms, a halogen-substituted aryl group with 6 to 20 carbon atoms, or an aralkyl group with 7 to 20 carbon atoms, such as the above-mentioned groups. In the formula, $R^2$ independently represents an alkyl group with 1 to 20 carbon atoms, a halogen-substituted alkyl group with 1 to 20 carbon atoms, an aryl group with 6 to 20 carbon atoms, a halogen-substituted aryl group with 6 to 20 carbon atoms, or an aralkyl group with 7 to 20 carbon atoms, and examples include the same groups as in the $R^1$.

In the formula, i, ii, iii, iv, and v each represent molar fraction of each siloxy unit, i is a number within the range of 0 to 0.6, ii is a number within the range of 0 to 0.6, iii is a number within the range of 0 to 1, iv is a number within the range of 0 to 1, v is a number within the range of 0 to 0.6, wherein, ii+iii+iv+v>0 and i+ii+iii+iv+v is equal to or smaller than 1. The component ($a_5$) preferably contains 0 to 35 mol % of silanol group [≡SiOH] in one molecule.

The component ($a_6$) is straight chain organosiloxane as expressed by the general formula:

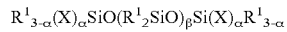

$$R^1{}_{3-a}(X)_aSiO(R^1{}_2SiO)_\beta Si(X)_aR^1{}_{3-a}$$

In the formula, $R^1$ represents the above-mentioned groups. In the formula, X is a hydrolytic group selected from —$OR^5$, F, Cl, Br, I, —OC(O)$R^5$, —N($R^5$)$_2$, or —ON=C$R^5{}_2$ (here, $R^5$ represents hydrogen atoms or an alkyl group with 1 to 6 carbon atoms). In the formula, a independently represents 1, 2, or 3, and 13 is an integer of 50 to 300.

The component ($a_7$) is a siloxane compound as expressed by the general formula:

$$R^1R^2{}_2SiX$$

In the formula, $R^1$, $R^2$, and X represent the above-mentioned groups.

The condensation reaction catalyst for condensation reaction of the component ($a_5$) and the component ($a_6$) and/or the component ($a_7$) is not specifically limited, and examples thereof include organotin compounds such as dibutyltin dilaurate, dibutyltin diacetate, octenoic acid tin, dibutyltin dioctate, and lauric acid tin; organic titanium compounds such as tetrabutyl titanate, tetrapropyl titanate, and dibutoxybis (ethyl acetoacetate); acid compounds such as hydrochloric acid, sulfuric acid, and dodecylbenzenesulfonic acid; alkali compounds such as ammonia and sodium hydroxide; amine-based compound such as 1,8-diazabicyclo[5.4.0]undecene (DBU) and 1,4-diazabicyclo[2.2.2]octane (DABCO).

Preferably, the component (A) is hot-meltable, specifically, is non-fluid at 25° C., and has a melting viscosity of 8000 Pa·s or lower at 100° C. Here, non-fluid refers to not flowing in the unloaded state, for example, the state of being lower than the softening point measured by the softening point testing method in the ball and ring method of hot melt adhesives specified in "Testing methods for the softening point of hot melt adhesives" of JIS K 6863-1994. That is, in order to be non-fluid at 25° C., the softening point must be higher than 25° C.

The melting viscosity of the component (A) at 100° C. is preferably 8000 Pa·s or lower, 5000 Pa·s or lower, or within the range 10 to 3000 Pa·s. When the melt viscosity at 100° C. is within the above-mentioned range, adhesiveness after hot-melting and cooling to 25° C. is favorable.

The particle diameter of the component (A) is not specifically limited as long as it is a microparticle. However, the average primary particle diameter is preferably within the range 1 to 5000 µm, within the range 1 to 500 µm, within the range 1 to 100 µm, within the range 1 to 20 µm, or within the range 1 to 10 µm. The average primary particle diameter can be found, for example, by observing using an optical microscope or a SEM. The shape of the component (A) is not specifically limited and may be spherical, spindle-shaped, plate-shaped, needle-shaped, and indefinite, and for uniform melting, spherical or completely-spherical is preferable. In particular, by making the component (A) particles into complete spheres of 1 to 10 µm, melting properties and mechanical properties after curing of the present compound can be suitably improved.

The method of manufacturing the component (A) is not limited, and may be any publicly known method. For example, the component (A) may be merely granulated, or a step of cross-linking at least two types of organopolysiloxane and a step of granulating the reactant may be performed simultaneously or separately.

In the method of cross-linking at least two types of organopolysiloxane and granulating the acquired silicone, for example, the silicone may be ground using a grinder, or may be directly granulated in the presence of a solvent. While not limited thereto, examples of the grinder include a roll mill, a ball mill, a jet mill, a turbo mill, and a planetary mill. Examples of the method of directly granulating the silicone in the presence of a solvent include spraying using a spray drier, and granulation using a biaxial mixer or a belt drier. According to the present invention, the completely-spherical hot-meltable silicone particles acquired by spraying using a spray drier are especially preferable in terms of melting properties of particulate compound, flexibility of the cured product, the amount of the component (B), the efficiency at production, and handling workability of the composition.

Use of the spray drier can produce the spherical component (A) having an average primary particle diameter of 1 to 500 µm. The heating and drying temperatures of the spray drier need to be appropriately set based on the thermal resistance of the silicone particulates and so on. To prevent secondary cohesion of silicone particulates, it is preferable to control the temperature of the silicone particulates to the glass transition temperature thereof or lower. The silicone particulates thus acquired can be collected by a cyclone, a bag filter, or the like.

To acquire the uniform component (A), in the above-mentioned step, a solvent may be used so as not to impair curing reaction. While not limited thereto, examples of the solvent include aliphatic hydrocarbons such as n-hexane, cyclohexane, and n-heptane; aromatic hydrocarbons such as toluene, xylene, and mesitylene; ethers such as tetrahydrofuran and dipropyl ether; silicones such as hexamethyldisiloxane, octamethyl trisiloxane, and decamethyl tetrasiloxane; esters such as ethyl acetate, butyl acetate, and propylene glycol methyletheracetate; and ketones such as acetone, methyl ethyl ketone, and methyl isobutyl ketone.

The component (B) of the present invention is an inorganic filler that is substantially free of having an average particle diameter of 10.0 µm or more. The inorganic filler that contains no coarse particles and the component (A) can be used together to provide curable particulate silicone composition that has excellent gap fill properties when melted, and gives the flexible cured product from room temperature to high temperatures. Here, "that is substantially free of having an average particle diameter of 10.0 µm" means when the component (B) is observed using an electronic microscope, coarse particles having an average particle diameter of 10.0 µm or more, or 5.0 µm or more in the major axis of particles are not observed, or when the distribution of particle diameter of the component (B) is measured by laser diffraction scattering particle size distribution or the like, the volume ratio of coarse particles having an average particle diameter of 10.0 µm or more, or 5.0 µm or more is less than 1%.

Preferably, such component (B) is preferably at least one type of filler that has no softening point or does not soften at the softening point of the component (A) or lower, and may be any component that improves handling workability of the present composition and gives mechanical and other properties to the cured product of the present composition. Examples of the component (B) include an inorganic filler, an organic filler, and a mixture thereof, and the inorganic filler is preferable. Examples of the inorganic filler include a reinforcing filler, a white pigment, a thermal conductive filler, an electrical conductive filler, a phosphor, and mixtures of at least two types of them, preferably the reinforcing filler that is substantially free of coarse particles having an average particle diameter of 5 µm or more. Examples of the organic filler include a silicone resin filler, a fluorine resin filler, and a polybutadiene resin filler. While not limited thereto, the shape of these filters may be spherical, spindle-shaped, flat, needle-shaped, or indefinite.

In the case where the present composition is used as a sealing agent, a protective agent, an adhesive, a light reflective material and the like, to enhance the mechanical strength to cured product and improve protective or adhesive properties, it is preferable to contain the reinforcing filler as the component (B). Examples of the reinforcing filler include fumed silica, settling silica, fused silica, calcined silica, fumed titanium dioxide, quartz, calcium carbonate, diatomaceous earth, aluminum oxide, aluminum hydroxide, zinc oxide, and zinc carbonate. These reinforcing fillers may be surface-treated with organoalkoxysilane such as methyltrimethoxysilane; organohalosilane such as trimethylchlorosilane; organosilazane such as hexamethyldisilazane; and siloxane oligomers such as dimethylsiloxane oligomer blocked with α,ω-silanol group, methylphenyl siloxane oligomer blocked with α,ω-silanol group, and methylvinyl siloxane oligomer blocked with α,ω-silanol group. The reinforcing filler is substantially free of coarse particles having an average particle diameter of 5 µm or larger. Further, fibrous fillers such as calcium metasilicate, potassium titanate, magnesium sulfate, sepiolite, xonotlite, aluminum borate, rock wool, and glass fiber may be used as the reinforcing filler.

In particular, to add excellent gap fill properties when melted to the present composition and flexibility from room temperature to high temperatures to the cured product, the component (B) is preferably a mixture of an inorganic filler, preferably reinforcing filler (b1) having an average particle diameter of 0.1 μm or lower, and an inorganic filler, preferably reinforcing filler (b2) having an average particle diameter of 0.1 to 5.0 μm. The compounding ratio of both inorganic fillers may be any mass ratio such as 1/99 to 20/80, 1/99 to 50/50, or 5/95 to 40/60. In particular, the component (B) may contain fumed silica (b1-1) having an average particle diameter of 0.1 μm or lower, preferably 0.05 μm or lower, and fused silica (b2-1) having an average particle diameter of 0.1 to 5.0 μm, preferably 0.15 to 4.0 μm at a ratio of 1/99 to 20/80, preferably 1/99 to 50/50, more preferably 5/95 to 40/60. When such mixture of the inorganic fillers has the same or similar particle diameter as the component (A), an excellent silicone-filler matrix when melted can be formed. This can improve flexibility and mechanical strength of the cured product. Since the filler is substantially free of coarse particles, excellent gap fill properties can be achieved.

The curable particulate silicone composition of the present invention may be used as a light reflection material, in particular, a light reflection material for light emitting diodes (LED). To enhance brightness of the cured product and improve the light reflectivity, a white pigment that is substantially free of coarse particles having an average particle diameter of 10.0 μm or more may be used as the component (B). Examples of the white pigment include metal oxide such as titanium oxide, aluminum oxide, zinc oxide, zirconium oxide, and magnesium oxide; hollow filler such as glass balloon and glass bead; barium sulphate, zinc sulfate, barium titanate, aluminum nitride, boron nitride, antimony oxide. Due to high light reflectivity and concealing properties, the titanium oxide is preferable. Due to high light reflectivity in an UV area, aluminum oxide, zinc oxide, and barium titanate are preferable. The white pigment may be surface-treated with silane coupling agent, silica, aluminum oxide, or so on. An especially preferable white pigment is titanium oxide particulates having an average particle diameter of 0.5 μm or lower, and is highly filled into the composition, thereby adding high light reflectivity and concealing properties in the visible wavelength region to the cured product, as well as substantially keeping the light reflectivity uniform on the low-wavelength side and the high-wavelength side in the visible wavelength region.

As long as the component (B) is substantially free of coarse particles having an average particle diameter of 10.0 μm or more, the component (B) may contain silicone particulates that do not correspond to the component (A), and can improve the stress relaxation properties or adjust the stress relaxation properties as desired. Examples of the silicone particulate include nonreactive silicone resin particulate and silicone elastomer particulate, and in terms of an improvement in flexibility or stress relaxation properties, the silicone elastomer particulate is preferable.

The silicone elastomer particulate is a cross-linked product of straight chain diorganopolysiloxane mainly composed of diorganosiloxy units (D units). The silicone elastomer particulate can be suitably prepared by cross-linking reaction of diorganopolysiloxane such as hydrosilylation reaction or condensation reaction of a silanol group. In particular, organohydrogenpolysiloxane having silicon-bonded hydrogen atoms on side chain or terminal and diorganopolysiloxane having an unsaturated hydrocarbon group such as alkenyl group on side chain or terminal, in the presence of a hydrosilylation catalyst. The silicone elastomer particulates may have various shapes such as spherical, flat, and indefinite shape, preferably spherical in terms of dispersiveness, most particular completely spherical. Commercial articles of the silicone elastomer particulates are, for example, "Trefill E Series" manufactured by Dow Corning Toray Co., Ltd., "EP Powder Series", and "KMP Series" manufactured by Shin-Etsu Chemical Co., Ltd.

The silicone elastomer particulates may be surface-treated. Examples of a finishing agent include methylhydrogenpolysiloxane, silicone resin, metallic soap, silane coupling agent, silica, inorganic oxides such as titanium oxide, perfluoroalkylsilane, and fluorine compounds such as perfluoroalkyl phosphoric acid ester.

In the case where the present composition is used as an LED wavelength conversion material, to convert the light-emitting wavelength from semiconductor elements, the component (B) may contain a phosphor. As long as the phosphor is substantially free of coarse particles having an average particle diameter of 5 μm or more, the phosphor may be yellow, red, green, and blue light phosphors, which include oxide phosphors, oxynitride phosphors, nitride phosphors, sulfide phosphors, oxysulfide phosphors, and the like, which are widely used in light emitting diodes (LED). Examples of the oxide phosphors include yttrium, aluminum, and garnet-type YAG green to yellow light phosphors containing cerium ions, terbium, aluminum, and garnet-type TAG yellow light phosphors containing cerium ions, and silicate green to yellow light phosphors containing cerium or europium ions. Exemplary oxynitride phosphors include silicon, aluminum, oxygen, and nitrogen type Sialon red to green light phosphors containing europium ions. Examples of nitride phosphors include calcium, strontium, aluminum, silicon, and nitrogen-type CASN red light phosphors containing europium ions. Exemplary sulfide phosphors include ZnS green light phosphors containing copper ions or aluminum ions. Exemplary oxysulfide phosphors include $Y_2O_2S$ red light phosphors containing europium ions. In the present composition, two or more of these phosphors may be used in combination.

Further, to add thermal conductivity and electrical conductivity to the cured product, the present composition may contain a thermal conductive filler or an electrical conductive filler. The thermal conductive filler or the electrical conductive filler, as long as it is substantially free of coarse particles having an average particle diameter of 5 μm or more, may be metallic micropowders such as gold, silver, nickel, copper, and aluminum; micropowders formed by evaporating or plating metal such as gold, silver, nickel, or copper on surfaces of micropowders such as ceramic, glass, quartz, organic resin; metallic compounds such as aluminum oxide, magnesium oxide, aluminum nitride, boron nitride, zinc oxide; graphite, and two or more types of mixtures of them. In the case where the present composition requires electrical insulation properties, metal oxide-based powders or metal nitride-based powders are preferable, and in particular, aluminum oxide powders, zinc oxide powders, or aluminum nitride powders are more preferable.

While not limited thereto, the content of the component (B) is preferably within the range 10 to 2000 parts by mass, within the range 1 to 1500 parts by mass, or within the range 10 to 1000 parts by mass, with respect to 100 parts by mass of the component (A). Especially, the component (B) of the present invention is substantially free of coarse particles having an average particle diameter of 10.0 μm or more, and when a relatively large amount of component (B) is included in the component (A), handling workability and gap fill properties when melted of the composition do not lower, and the acquired cured product has excellent flexibility and mechanical strength from room temperature to high temperatures. Thus, the component (B) can be preferably included by 50 to 900 parts by mass, 100 to 800 parts by mass, or 150 to 750 parts by mass with respect to the component (A) of 100 parts by mass. Further, 50 percent by mass or higher, 60 percent by mass or higher, or 70 percent by mass of the composition of the present invention may be the above-mentioned component (B).

The component (C) is a curing agent for curing the component (A), and may be any agent that can cure the component (A). When the component (A) contains the alkenyl group, the component (C) is organohydrogenpolysiloxane having at least two silicon-bonded hydrogen atoms in one molecule, and a hydrosilylation catalyst. When the component (A) contains the alkenyl group and the hydrosilylation catalyst, the component (C) may only contain the organopolysiloxane having at least two silicon-bonded hydrogen atoms in one molecule, or use both of the organopolysiloxane and the hydrosilylation catalyst. When the component (A) contains the alkenyl group, the component (C) may be an organic peroxide, or contain organopolysiloxane having at least two silicon-bonded hydrogen atoms in one molecule as well. When the component (A) has silicon-bonded hydrogen atoms, the component (C) contains organopolysiloxane having at least two alkenyl groups in one molecule and a hydrosilylation catalyst. When the component (A) has silicon-bonded hydrogen atoms and a hydrosilylation catalyst, the component (C) may contain only organopolysiloxane having at least two alkenyl groups in one molecule, or may contain the hydrosilylation catalyst as well.

Examples of organopolysiloxane in the component (C) include alkenyl group-containing organopolysiloxane as expressed by the ($a_1$) and/or the ($a_2$), or silicon-bonded hydrogen atoms-containing organopolysiloxane as expressed by the ($a_3$) and/or the ($a_4$).

When organopolysiloxane is used as the component (C), while not limited thereto, to cure the present composition, the content of silicon-bonded hydrogen atoms is preferably within the range of 0.5 to 20 mols or within the range of 1.0 to 10 mols with respect to 1 mol of alkenyl group in the present composition.

Examples of the hydrosilylation catalyst include a platinum-based catalyst, a rhodium-based catalyst, and a palladium-based catalyst, and the platinum-based catalysts are preferable because it largely promotes curing of the present composition. Examples of this platinum-based catalyst include platinum fine powder, chloroplatinic acid, an alcohol solution of chloroplatinic acid, a platinum-alkenyl siloxane complex, a platinum-olefin complex, and a platinum-carbonyl complex, and these platinum-base catalysts distributed or encapsulated with thermoplastic resins such as silicone resin, polycarbonate resin and acryl resins, preferably the platinum-alkenyl siloxane complex. Examples of this alkenyl siloxane include: 1,3-divinyl-1,1,3,3-tetramethyldisiloxane; 1,3,5,7-tetramethyl-1,3,5,7-tetravinylcyclotetrasiloxane; an alkenyl siloxane obtained by substituting part of methyl groups of these alkenyl siloxanes with an ethyl group, a phenyl group, etc.; and an alkenyl siloxane obtained by substituting part of vinyl groups of these alkenyl siloxanes with an allyl group, a hexenyl group, etc. Especially, due to good stability of platinum-alkenylsiloxane complex, 1,3-divinyl-1,1,3,3-tetramethyl disiloxane is preferable. In addition, to improve handling workability and pot life of the composition, a particulate platinum-containing hydrosilylation catalyst distributed or encapsulated with thermoplastic resin may be used. A catalyst for promoting hydrosilylation reaction may be non-platinum-based catalyst such as iron, ruthenium, and iron/cobalt.

Preferably, the added amount of the hydrosilylation catalyst is an amount where metallic atoms are within the range of 0.01 to 500 ppm, within the range of 0.01 to 100 ppm, or within the range of 0.01 to 50 ppm in the units of mass with respect to the component (A).

Examples of the organic peroxide include alkyl peroxides, diacyl peroxides, ester peroxides, and carbonate peroxides.

Examples of alkyl peroxides include dicumyl peroxide, di-tert-butyl peroxide, di-tert-butylcumyl peroxide, 2,5-dimethyl-2,5-di(tert-butylperoxy)hexane, 2,5-dimethyl-2,5-di(tert-butylperoxy)hexyne-3, tert-butylcumyl, 1,3-bis(tert-butylperoxyisopropyl)benzene, and 3,6,9-triethyl-3,6,9-trimethyl-1,4,7-triperoxonan.

Examples of diacyl peroxides include benzoyl peroxide, lauroyl peroxide, and decanoyl peroxide.

Examples of ester peroxides include 1,1,3,3-tetramethylbutylperoxyneodecanoate, α-cumylperoxyneodecanoate, tert-butylperoxyneodecanoate, tert-butylperoxyneoheptanoate, tert-butylperoxypivalate, tert-hexylperoxypivalate, 1,1,3,3-tetramethylbutylperoxy-2-ethylhexanoate, tert-amylperoxyl-2-ethylhexanoate, tert-butylperoxy-2-ethylhexanoate, tert-butylperoxyisobutyrate, di-tert-butylperoxyhexahydroterephthalate, tert-amylperoxy-3,5,5-trimethylhexanoate, tert-butylperoxy-3,5,5-trimethylhexanoate, tert-butylperoxyacetate, tert-butylperoxybenzoate, and di-butylperoxytrimethyladipate.

Examples of carbonate peroxides include di-3-methoxybutyl peroxydicarbonate, di(2-ethylhexyl)peroxydicarbonate, diisopropyl peroxycarbonate, tert-butyl peroxyisopropylcarbonate, di(4-tert-butylcyclohexyl)peroxydicarbonate, dicetyl peroxydicarbonate, and dimyristyl peroxydicarbonate.

The organic peroxide whose half-life is 10 hours at 90° C. or higher, or 95° C. or higher is preferable. Examples of such organic peroxide include dicumyl peroxide, di-t-butyl peroxide, di-t-hexyl peroxide, t-butylcumyl peroxide, 2,5-dimethyl-2,5-di(tert-butylperoxy)hexane, 3-bis(tert-butylperoxyisopropyl)benzene, di-(2-t-butylperoxyisopropyl)benzene, and 3,6,9-triethyl-3,6,9-trimethyl-1,4,7-triperoxonan.

While not limited thereto, the content of the organic peroxide is preferably within the range 0.05 to 10 parts by mass, or within the range 0.10 to 5.0 parts by mass, with respect to 100 parts by mass of the component (A).

The present composition may contain a concrete retarder and an adhesion imparting agent as optical components as long as they do not impair the objects of the present invention.

Examples of the concrete retarder include: alkyne alcohols such as 2-methyl-3-butyne-2-ol, 3,5-dimethyl-1-hexyne-3-ol, 2-phenyl-3-butyne-2-ol; enyne compounds such as 3-methyl-3-pentene-1-yne, 3,5-dimethyl-3-hexene-1-yne; alkenyl group-containing low molecular weight siloxane such as tetramethyl tetravinyl cyclotetrasiloxane, tetramethyl tetrahexenyl cyclotetrasiloxane; and alkynoxysilanes such as methyl-tris(1,1-dimethyl propynyloxy)silane, vinyl-tris(1,1-dimethyl propynyloxy)silane. While not limited thereto, the content of this concrete retarder is preferably within the range 10 to 10000 ppm in the units of mass with respect to the present composition.

An organosilicon compound having at least one alkoxy group bonded to a silicon atom per one molecule is preferable as this adhesion imparting agent. Examples of this alkoxy group include a methoxy group, an ethoxy group, a propoxy group, a butoxy group, and a methoxyethoxy group, with a methoxy group particularly preferable. Moreover, examples of groups other than this alkoxy group bonded to the silicon atom of the organosilicon compound include: a halogen substituted or unsubstituted monovalent hydrocarbon group such as an alkyl group, an alkenyl group, an aryl group, an aralkyl group, and a halogenated alkyl group; a glycidoxyalkyl group such as a 3-glycidoxypropyl group and a 4-glycidoxybutyl group; epoxycyclohexylalkyl group such as a 2-(3,4-epoxycyclohexyl)ethyl group and a 3-(3,4-epoxycyclohexyl)propyl group; an epoxyalkyl group such as a 3,4-epoxybutyl group and a 7,8-epoxyoctyl group; an acryl group-containing monovalent organic group such as a 3-methacryloxypropyl group; and hydrogen atoms. This organosilicon compound preferably has a group that may react with an alkenyl group or a silicon atom bonded hydrogen atom in this composition, and specifically, preferably has a silicon atom bonded hydrogen atom or an alkenyl group. Moreover, because favorable adhesion can be imparted to various base materials, this organosilicon compound preferably has at least one epoxy group-containing a monovalent organic group per one molecule. Examples of such organosilicon compound include an organosilane compound, an organosiloxane oligomer, and an alkyl silicate. Examples of the molecular structure of this organosiloxane oligomer or alkyl silicate include a linear structure, a partially branched linear structure, a branched structure, a cyclic structure, and a network structure, with a linear structure, a branched structure, and a network structure particularly preferable. Examples of such organosilicon compound include: silane compounds such as 3-glycidoxypropyltrimethoxysilane, 2-(3,4-epoxycyclohexyl)ethyltrimethoxysilane, and 3-methacryloxypropyltrimethoxysilane; siloxane compounds having at least one of silicon-bonded alkenyl group and silicon-bonded hydrogen atoms, and at least one silicon bonded alkoxy group per one molecule; and mixtures of a silane compound or siloxane compound having at least one silicon-bonded alkoxy group and a siloxane compound having at least one silicon-bonded hydroxyl group and at least one silicon-bonded alkenyl group per one molecule; methylpolysilicate; ethylpolysilicate; and an epoxy group-containing ethylpolysilicate. The adhesion imparting agent is preferably a low-viscosity liquid, and while not limited thereto, the viscosity is preferably within the range 1 to 500 mPa·s at 25° C. While not limited thereto, the content of this adhesion imparting agent is preferably within the range 0.01 to 10 parts by mass with respect to 100 parts by mass of the present composition.

Further, the present composition may contain, as any optional component, at least one type of liquid organopolysiloxane in the (a1) to the (a4); heat resistant agents such as iron oxide (red ocher), cerium oxide, cerium dimethylsilanolate, fatty acid cerium salt, cerium hydroxide, and zirconium compound; mold release agents such as carnauba wax, montan wax, calcium stearate, calcium montanate, magnesium stearate, magnesium montanate, zinc stearate, zinc montanate, ester-based wax, and olefin-based wax; dyes, pigments other than white pigment, flame retarders, as long as they impair the objects of the present invention.

The above-mentioned composition uses both the component (B) that is substantially free of coarse particles having an average particle diameter of 10.0 μm or more, and the component (A) that is hot-meltable silicone particles. Therefore, the composition has excellent gap fill properties when melted (hot-melting) and the cured product is flexible at room temperature to high temperatures, specifically, 25° C. to 150° C., has excellent stress relaxation properties, and is hardly broken even when deformation such as bending occurs at room temperature. The component (B) preferably contains inorganic filler and however, by using a white pigment, a thermal conductive filler, an electrical conductive filler, or a phosphor, other functionality including improvement in the light reflectivity can be added.

Specifically, the cured product formed by curing the above-mentioned composition has a storage modulus (G') of 2000 Mpa or lower at 25° C., and 100 Mpa or lower at 150° C. Such cured product is flexible at both room temperature (25° C.) and high temperature (150° C.) and has excellent adhesiveness and followability to semiconductor substrates and the like. In addition, when used to seal semiconductor elements subjected to deformation such as the flexible semiconductor substrate, which have been recently introduced, the cured product can suppress failures including breakage, peeling, and void of the sealed semiconductor elements. In uses requiring high elongation and followability to deformation, the storage modulus (G') at 25° C. may be 1500 Mpa or lower, or 1000 Mpa or lower, and the storage modulus (G') at 150° C. may be 50 Mpa or lower, or 40 Mpa or lower.

The present composition may be used in the form of a pellet. The pellet of the present composition is acquired by tableting and molding the present composition, and has excellent handling workability and curability. Note that "pellet" may be referred to as "tablet". While not limited thereto, the shape of the pellet is generally, spherical, elliptical, or cylindrical. While not limited thereto, the size of the pellet has an average particle diameter or circle equivalent diameter of 500 μm or more.

The present composition may be molded into a sheet and used. For example, the sheet made of a curable particulate silicone composition having an average thickness of 500 μm or more, preferably a few mm has hot-melting properties and thermosetting properties at high temperatures. Especially when used in compression molding, the sheet is advantageous due to excellent handling workability and melting properties.

The present composition is non-fluid at 25° C. The non-fluid described herein means that the composition does not deform and flow in the unloaded state, preferably the composition molded into a pellet or tablet does not deform and flow at 25° C. and in the unloaded state. Such non-fluidity can be estimated based on that. when placed on a hot plate, for example, at 25° C. in the unloaded state of under a certain load, the present composition does not substantially deform and flow. This is due to the fact that, when being non-fluid at 25° C., the present composition has favorable shape retainability at this temperature and low surface tack.

The softening point of the present composition is preferably 100° C. or lower. Such softening point refers to the temperature at which a deformation of the present composition in the height direction becomes 1 mm or more, when the present composition on a hot plate is pressed by a load of 100 g from above for 10 seconds and then, the load is removed to measure the deformation.

Preferably, the present composition has a melting viscosity of 8000 Pa·s or lower, 6000 Pa·s or lower, or 5000 Pa·s or lower at 100° C. The melting viscosity at 100° C. is preferably 10 Pa·s or higher. This is due to the fact that, after hot-melting and cooling to 25° C., the present composition has good adhesiveness to the substrate. Note that the melting viscosity can be measured at a shear rate of 5[1/s] using a rheometer AR2000EX (manufactured by TA Instruments Japan).

The present composition has excellent curing properties. The curing properties of the present composition can be estimated using a rheometer. Given that a torque value at a certain temperature of 150 to 180° C. after three minutes is 100, the curing properties of the present composition can be evaluated based on $T_1$, $T_{90}$, which are the values of times (seconds) that can achieve 1% torque value and 90% torque value, respectively. In the present composition, $T_1$ measured at the certain temperature of 150 to 180° C. is preferably 20 seconds or more, or 25 seconds or more. $T_{90}$ measured at 150 to 180° C. is preferably 145 seconds or lower, or 140 seconds or lower. Examples of the rheometer used for measurement include a rheometer MDR2000 (manufactured by Alpha Technologies).

Method of Making for Curable Particulate Silicone Composition

The present composition can be produced by powder-mixing the components (A) to (C), and if necessary, other optional components at less than the softening point of the component (A). The powder mixer used in the method of making is not specifically limited, and examples thereof include a uniaxial or biaxial continuous mixer, a two roller, a ross mixer, a Hobart mixer, a dental mixer, a planetary mixer, a kneader mixer, a laboratory mixer, a compact grinder, a Henschel mixer, preferably the laboratory mixer, the compact grinder, and the Henschel mixer.

Molding Method of Cured Product

This composition may be cured by a method including at least following steps (I) to (III).

(I) heating the present composition to the softening point of the component (A) or higher and melting the composition;

(II) injecting the curable silicone composition acquired in the step (I) into a mold or spreading the curable silicone composition acquired in the step (I) in a mold by clamping; and (III) curing the curable silicone composition injected in the step (II).

As mentioned above, the present composition has excellent gap fill properties when melted, and the cured product has excellent flexibility from room temperature to high temperatures and therefore, the present composition can be applied to the molding method including the coating step (so-called mold underfilling) of simultaneously performing overmolding and underfilling of the semiconductor elements with the cured product extremely preferably. Further, due to the above-mentioned properties, the present composition can be preferably applied to the molding method including the coating step (so-called wafer molding) of coating the surface of the semiconductor wafer substrate that mounts one or more semiconductor elements and performing overmolding so as to fill a gap between the semiconductor elements with the cured product.

In the above-mentioned steps, a transfer molding machine, a compression molding machine, an injection molding machine, an auxiliary ram molding machine, a slide-type molder, a double-ram molding machine, a low-pressure sealing molding machine, or the like may be used. In particular, the composition of the present invention can be preferably used to acquire the cured product by transfer molding or compression molding. In particular, the sheet-like composition of the present invention is useful as the material for compression molding.

Finally, in the step (III), the curable silicone composition injected (applied) in the step (II) is cured. When organic peroxide is used as the component (C), the heating temperature is preferably 150° C. or higher, or 170° C. or higher.

As a suitable protective member for semiconductors and the like, the type D durometer hardness of the cured product acquired by curing the present composition at 25° C. is preferably 50 or higher, or 60 or higher. The type D durometer hardness is found using the type D durometer according to the JIS K 6253-1997 "Vulcanized Rubber and Thermoplastic Rubber Hardness Test Method".

Further, as a suitable sealing member for semiconductors in flexible use requiring flexibility, the flexural elongation rate of the cured product measured according to the method prescribed in the JIS K 6911-1995 "Thermosetting Plastic General Test Method" is preferably 2% or higher, or 4% or higher.

Uses of Composition

The present composition is hot-meltable, and has excellent gap fill properties at melted (hot melting), handling workability, and curability and therefore is suitable as sealing agents and underfill agents for semiconductors; sealing agents and underfill agents for power semiconductors such as SiC and GaN; sealing agents and light reflection members for optical semiconductors such as a light emitting diode, a photo diode, a photo transistor, and a laser diode; electric and electronic adhesives, potting agents, protective agents, and coating agents. The present composition is hot-meltable and thus, is suitable as a material for transfer molding, compression molding, or injection molding. Especially, the present composition is suitable as a sealing agent for semiconductors using mold underfilling or wafer molding at molding.

Uses of Cured Product

Uses of the cured product of the present invention are not specifically limited. The composition of the present invention is hot-meltable and has excellent moldability and gap fill properties, and the cured product has flexibility at room temperature, high stress relaxation properties, and flexural elongation rate. For this reason, the cured product formed by curing the present composition can be preferably used as semiconductor device members, including sealing members for semiconductor elements and IC chips, light reflection members for optical semiconductor devices, and adhesives and coupling members for semiconductor devices.

While not limited thereto, the semiconductor device including the cured product of the present invention is preferably power semiconductor devices, optical semiconductor devices, and semiconductor devices mounted on the flexible circuit board.

EXAMPLES

The curable particulate silicone composition and a method of making the curable particulate silicone composition according to the present invention will be described below in more detail using Examples and Comparative Examples. Note that in the formulae, Me, Ph, and Vi represent a methyl group, a phenyl group, and a vinyl group, respectively. For curable silicone compositions in Examples and Comparative Examples, the softening point, the melting viscosity, the moldability, warpage of the molded product, the flexural elongation rate of the cured product, and the storage modulus were measured, and depicted in Table 1 and Table 2.

Softening Point of Hot-Meltable Silicone

Hot-meltable silicone was placed on a hot plate set to 25° C. to 100° C., and the temperature at which the silicone was liquidized was defined as the softening point while checking the state with a spatula.

Softening Point of Curable Particulate Silicone Composition

The curable particulate silicone composition was molded into a cylindrical pellet of φ14 mm×22 mm. The pellet was placed on a hot plate set to 25° C. to 100° C., and pressed with a load of 100 g from above for 10 seconds. After removal of the load, the amount of deformation of the pellet was measured. The temperature at which the amount of deformation in the height direction became 1 mm or larger was defined as the softening point.

Melting Viscosity

The melting viscosity of the hot-meltable silicone and the curable particulate silicone composition at 100° C. was measured at a shear rate of 5(1/s) using a rheometer AR2000EX (manufactured by TA Instrument Japan Inc.).

Moldability and Warpage of Molded Product

A curable particulate silicone composition was molded integrally with a copper leadframe using a transfer molding machine to make a molded product of 35 mm long x 25 mm wide×1 mm height. As molding conditions, in Examples 1 to 7, 9 and Comparative Examples 1 and 2, the mold temperature was set to 150° C. and the clamping time was set to 120 seconds, and in Example 8, the mold temperature was set to 180° C., and the clamping time was set to 120 seconds. A molded product was taken out of the mold and cooled to 25° C. Then, the presence/absence of cracks and molding failure such as peeling from the leadframe was visually checked.

One side of the molded leadframe was fixed to a horizontal table with a tape, and a floating distance of the other side of the leadframe from the table was measured. The measurement value was defined as the warpage value of the molded product.

Storage Modulus of Cured Product

The curable silicone composition was heated for two hours at 150° C. to prepare a cured product. The storage modulus of the cured product from −50° C. to 250° C. were measured using a rheometer ARES (manufactured by TA Instrument Japan) to read values at 25° C. and 150° C.

Flexural Elongation of Cured Product

The curable silicone composition was heated for two hours at 150° C. to prepare a cured product. A 3-point flexural test for the flexural elongation of the cured product was performed according to the method prescribed in the JIS K 6911-1995 "Thermosetting Plastic General Test Method" to read the elongation percentage.

Reference Example 1

270.5 g of resinoid organopolysiloxane 55 percent by mass in toluene solution that is a white solid at 25° C. as expressed by average unit formula:

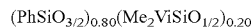
(PhSiO$_{3/2}$)$_{0.80}$(Me$_2$ViSiO$_{1/2}$)$_{0.20}$ 21.3 g (0.5 mol of silicon-bonded hydrogen atoms in the present composition with respect to 1 mol of vinyl group in the resinoid organopolysiloxane) of diphenylsiloxane having both molecular chain terminals blocked with dimethylhydrodienesiloxy group (the content of silicon-bonded hydrogen atoms=0.6 percent by mass) having a viscosity of 5 mPa·s as expressed by the formula:

HMe$_2$SiO(Ph$_2$SiO)SiMe$_2$H, and 0.034 g (10 ppm of platinum metal in the units of mass with respect to the present liquid mixture) of platinum 1,3-divinyltetramethyldisiloxane complex in 1,3-divinyltetramethyl disiloxane solution (the content of platinum metal=about 4000 ppm) were injected into a 1 L flask, and were uniformly stirred at room temperature. Then, the temperature of the flask was increased to 100° C. by an oil bath, and stirred for two hours under reflux of toluene to prepare organosiloxane cross-linked product (1) in toluene solution that includes resinoid organosiloxane deriving from the above-mentioned resinoid organopolysiloxane and chain organosiloxane deriving from the above-mentioned diphenylsiloxane, and has a vinyl group unrelated to the above-mentioned reaction. When the organosiloxane cross-linked product (1) was analyzed according to the FT-IR, a peak of silicon-bonded hydrogen atoms was not observed. The softening point of the organosiloxane cross-linked product (1) was 75° C., and the melting viscosity at 100° C. was 700 Pa·s.

Reference Example 2

318.6 g of organopolysiloxane 56.5 percent by mass-toluene solution as expressed by the average unit formula:

(PhSiO$_{3/2}$)$_n$ (In the figure, n is a positive number of 1500 of the weight average molecular weight of organopolysiloxane) was injected into a four 500 mL 4-port round-bottom flask provided with a Dean-Stark apparatus that is coupled to a thermometer, a Teflon (registered trademark) stirring blade, and a water-cooled condenser and previously filled with toluene under a nitrogen atmosphere. It was heated at the toluene reflux temperature for 30 minutes to remove 0.54 g of water. Next, it was cooled to 108° C., and 224.24 g of methylphenyl polysiloxane mixture acquired by previously reacting a 4.24 g (0.0187 mol) of mixture of methyl triacetoxysilane/ethyl triacetoxysilane with a molar ratio of 1:1 with 220 g (1.614 mol) of methylphenyl polysiloxane having both molecular chain terminals blocked with silanol group (polymerization degree=181) at room temperature for one hour was added. The reaction mixture was heated in nitrogen atmosphere at the toluene reflux temperature for two hours to further remove 2.01 g of water. Then, the reaction solution was cooled to 108° C. again, and 11.91 g (0.0633 mol) of vinylmethyl diacetoxysilane was added. The mixture was further heated at the toluene reflux temperature for one hour to remove 1.05 g of water. The reaction mixture was cooled to 90° C., and 47.8 g of deionized water was added. Then, water was removed by azeotropic distillation. The reaction solution was cooled to 108° C. again, and 21.57 g (0.0949 mol) of a mixture of methyltriacetoxysilane/ethyl triacetoxysilane with a molar ratio 1:1 was added. The mixture was refluxed for one hour. Then, the reaction mixture was cooled to 90° C. and 47.8 g of deionized water was added. The mixture was refluxed by azeotropic distillation to remove water (such procedure of adding and removing water was repeated twice). The same water treatment was repeated three times and finally, 103.6 g of volatile component was removed at 118° C. by distillation, and solid content of the reaction solution was adjusted to about 70 percent by mass. It was found that the acquired product was an organosiloxane block copolymer consisting of a resinoid organosiloxane block containing 2 mol % of vinyl group and a straight chain organosiloxane block. The softening point of the organosiloxane block copolymer (2) was 85° C., and the melting viscosity at 100° C. was 2800 Pa·s.

Next, 0.034 g (10 ppm of platinum metal in units of mass with respect to the present liquid mixture) of platinum 1,3-divinyltetramethyldisiloxane complex in 1,3-divinyltetramethyldisiloxane solution (the content of platinum metal=about 4000 ppm) was added to 292 g of organosiloxane block copolymer having a solid content of 50 percent by mass in solution. The mixture was uniformly stirred at room temperature (25° C.) to prepare organosiloxane block copolymer (2) in toluene solution containing a platinum catalyst.

Reference Example 3

270.5 g of resinoid organopolysiloxane 55 percent by mass in toluene solution that is a while solid at 25° C. as expressed by the average unit formula:

(PhSiO$_{3/2}$)$_{0.80}$(Me$_2$ViSiO$_{1/2}$)$_{0.20}$, and 0.034 g of platinum 1,3-divinyltetramethyl disiloxane complex in 1,3-divinyltetramethyl disiloxane solution (the content of platinum metal=about 4000 ppm) was injected into a 1 L flask, and uniformly stirred at room temperature (25° C.) to prepare resinoid organopolysiloxane (3) toluene solution having 10 ppm of platinum metal in units of mass. The softening point of the resinoid organopolysiloxane (3) was 100° C., and the melting viscosity at 100° C. was 100 Pa·s.

Reference Example 4

The organosiloxane cross-linked product (1) in toluene solution prepared in Reference example 1 was granulated while removing toluene at 40° C. by spray dry to prepare completely-spherical hot-meltable silicone particles (1). When the particulates were observed using an optical microscope, the particle diameter was 5 to 10 µm, and the average particle diameter was 7.5 µm.

Reference Example 5

Toluene solution of the organosiloxane cross-linked product (1) prepared in Reference example 1 was injected into a biaxial mixer heated to 150° C. to remove toluene, and the acquired organosiloxane cross-linked product (1) was ground using a ball mill while being cooled to prepare an indefinite shape of hot-meltable silicone particles (2). When the particulates were observed using an optical microscope, the particle diameter was 1000 to 3000 µm, and the average particle diameter was 1500 µm.

Reference Example 6

The organosiloxane block copolymer (2) in toluene solution prepared in Reference Example 2 was granulated while removing toluene at 40° C. by spray dry to prepare completely-spherical hot-meltable silicone particles (3). When the particulates were observed using an optical microscope, the particle diameter was 5 to 10 µm, and the average particle diameter was 6.5 µm.

Reference Example 7

The resinoid organopolysiloxane (3) in toluene solution prepared in Reference Example 3 was granulated while removing toluene at 40° C. by spray dry to prepare completely-spherical hot-meltable silicone particles (4). When the particulates were observed using an optical microscope, the particle diameter was 5 to 10 µm, and the average particle diameter was 7.9 µm.

Example 1

89.3 g of hot-meltable silicone particles (1),
10.7 g of diphenylsiloxane having both molecular chain terminals blocked with dimethylhydrodienesiloxy group (the content of silicon-bonded hydrogen atoms=0.6 percent by mass) having a viscosity of 5 mPa·s as expressed by the formula:

HMe$_2$SiO(Ph$_2$SiO)SiMe$_2$H (1.0 mol of silicon-bonded hydrogen atoms in the above-mentioned diphenylsiloxane with respect to 1 mol of vinyl group in the silicone particulates (1)),
1-ethynyl-1-cyclohexanol (300 ppm in units of mass with respect to the present composition),
290.2 g of fused silica having an average particle diameter of 0.5 µm (SP507-05 manufactured by NIPPON STEEL Chemical & Material Co., Ltd), and
13.4 g of fumed silica having an average particle diameter of 0.04 µm (AEROSIL50 manufactured by NIPPON AEROSIL CO., LTD)
were collectively injected into a compact grinder, and stirred at room temperature (25° C.) for one minute to prepare a uniform white curable particulate silicone composition. Next, the present composition was tableted by a tableting machine into cylindrical pellets having a diameter of 14 mm and a height of 22 mm.

Example 2

74.1 g of hot-meltable silicone particles (1),
11.1 g of diphenylsiloxane having both molecular chain terminals blocked with dimethylhydrodienesiloxy group (the content of silicon-bonded hydrogen atoms=0.6 percent by mass) having a viscosity of 5 mPa·s as expressed by the formula:

HMe$_2$SiO(Ph$_2$SiO)SiMe$_2$H, 14.8 g of methylphenyl polysiloxane having both molecular chain terminals blocked with dimethylvinylsiloxy group (the content of vinyl group=2.1 percent by mass) having a viscosity of 1,000 mPa·s as expressed by the average formula:

ViMe$_2$SiO(MePhSiO)$_5$SiMe$_2$Vi, (1.0 mol of silicon-bonded hydrogen atoms in the above-mentioned diphenylsiloxane with respect to 1 mol of vinyl group in the silicone particulates (1) and methylphenylpolysiloxane having both molecular chain terminals blocked with dimethylvinylsiloxy group), 1-ethynyl-1-cyclohexanol (300 ppm in units of mass with respect to the present composition),
288.9 g of fused silica having an average particle diameter of 0.5 µm (SP507-05 manufactured by NIPPON STEEL Chemical & Material Co., Ltd), and
14.8 g of fumed silica having an average particle diameter of 0.04 µm (AEROSIL50 manufactured by NIPPON AEROSIL CO., LTD)
were collectively injected into a compact grinder, and stirred at room temperature (25° C.) for one minute to prepare a uniform white curable particulate silicone composition. Next, the present composition was tableted by a tableting machine into cylindrical pellets having a diameter of 14 mm and a height of 22 mm.

Example 3

70.2 g of hot-meltable silicone particles (1),
11.2 g of diphenylsiloxane having both molecular chain terminals blocked with dimethyl hydrodienesiloxy group (the content of silicon-bonded hydrogen atoms=0.6 percent by mass) having a viscosity of 5 mPa·s as expressed by the formula:

HMe$_2$SiO(Ph$_2$SiO)SiMe$_2$H 18.6 g of methylphenyl polysiloxane having both molecular chain terminals blocked with dimethylvinylsiloxy group (the content of the vinyl group=2.1 percent by mass) having a viscosity of 1,000 mPa·s as expressed by the average formula:

ViMe$_2$SiO(MePhSiO)$_5$SiMe$_2$Vi (1.0 mol of silicon-bonded hydrogen atoms in the above-mentioned diphenylsiloxane with respect to silicone particulates (1) and 1 mol of vinyl group in methylphenyl polysiloxane having both molecular chain terminals blocked with dimethylvinylsiloxy group), 126.3 g of fused silica having an average particle diameter of 0.1 μm (EMIX-100 manufactured by TATSUMORI LTD.), and 26.0 g of fumed silica having an average particle diameter of 0.04 μm (AEROSIL50 manufactured by NIPPON AEROSIL CO., LTD.)

were collectively injected into a compact grinder, and stirred at room temperature (25° C.) for one minute to prepare uniform white curable particulate silicone composition. Next, the present composition was tableted by a tableting machine into cylindrical pellets having a diameter of 14 mm and a height of 22 mm.

Example 4

90.9 g of hot-meltable silicone particles (3), 4.5 g of diphenylsiloxane having both molecular chain terminals blocked with dimethyl hydrodienesiloxy group (the content of silicon-bonded hydrogen atoms=0.6 percent by mass) having a viscosity of 5 mPa·s as expressed by the formula:

HMe$_2$SiO(Ph$_2$SiO)SiMe$_2$H, 4.5 g of branched chain organopolysiloxane (the content of silicon-bonded hydrogen atoms=0.65 percent by mass) that has two or more silicon-bonded hydrogen atoms in one molecule, and a viscosity of 25 mPa·s as expressed by the average unit formula:

(Me$_3$SiO$_{3/2}$)$_{0.4}$(SiO$_{1/2}$)$_{0.6}$, (1.0 mol of silicon-bonded hydrogen atoms in the above-mentioned diphenylsiloxane and the above-mentioned organopolysiloxane with respect to 1 mol of vinyl group in the silicone particulates (3)), 290.9 g of fused silica (SP507-05 manufactured by NIPPON STEEL Chemical & Material Co., Ltd) having an average particle diameter of 0.5 μm, and 9.1 g of fumed silica (AEROSIL50 manufactured by NIPPON AEROSIL CO., LTD.) having an average particle diameter of 0.04 μm were collectively injected into a compact grinder, and stirred at room temperature (25° C.) for one minute to prepare uniform white curable particulate silicone composition. Next, the present composition was tableted by a tableting machine into cylindrical pellets having a diameter of 14 mm and a height of 22 mm.

Example 5

78.1 g of hot-meltable silicone particles (4), 21.9 g of diphenylsiloxane having both molecular chain terminals blocked with dimethyl hydrodienesiloxy group (the content of silicon-bonded hydrogen atoms=0.6 percent by mass) having a viscosity of 5 mPa·s as expressed by the formula:

HMe$_2$SiO(Ph$_2$SiO)SiMe$_2$H (1.0 mol of silicon-bonded hydrogen atoms in the above-mentioned diphenylsiloxane with respect to 1 mol of the vinyl group in the silicone particulates (4)), and 285.2 g of fused silica having an average particle diameter of 0.5 μm (SP507-05 manufactured by NIPPON STEEL Chemical & Material Co., Ltd), and 19.5 g of fumed silica having an average particle diameter of 0.04 μm (AEROSIL50 manufactured by NIPPON AEROSIL CO., LTD)

were collectively injected into a compact grinder, and stirred at room temperature (25° C.) for one minute to prepare uniform white curable particulate silicone composition. Next, the present composition was tableted by a tableting machine into cylindrical pellets having a diameter of 14 mm and a height of 22 mm.

Example 6

74.1 g of hot-meltable silicone particles (1), 11.1 g of diphenylsiloxane having both molecular chain terminals blocked with dimethylhydrodienesiloxy group (the content of silicon-bonded hydrogen atoms=0.6 percent by mass) having a viscosity of 5 mPa·s as expressed by the formula:

HMe$_2$SiO(Ph$_2$SiO)SiMe$_2$H, 14.8 g of methylphenyl polysiloxane having both molecular chain terminals blocked with dimethylvinylsiloxy group (the content of vinyl group=2.1 percent by mass) having a viscosity of 1,000 mPa·s as expressed by the average formula:

ViMe$_2$SiO(MePhSiO)$_5$SiMe$_2$Vi, (1.0 mol of silicon-bonded hydrogen atoms in the above-mentioned diphenylsiloxane with respect to 1 mol of vinyl group in the silicone particulates (1) and methylphenylpolysiloxane having both molecular chain terminals blocked with dimethylvinylsiloxy group), 1-ethynyl-1-cyclohexanol (300 ppm in units of mass with respect to the present composition), 132.2 g of titanium oxide having an average particle diameter of 0.5 μm (SX-3103 manufactured by SAKAI CHEMICAL INDUSTRY CO., LTD.), and 23.3 g of fumed silica having an average particle diameter of 0.04 μm (AEROSIL50 manufactured by NIPPON AEROSIL CO., LTD.)

were collectively injected into a compact grinder, and stirred at room temperature (25° C.) for one minute to prepare uniform white curable particulate silicone composition. Next, the present composition was tableted by a tableting machine into cylindrical pellets having a diameter of 14 mm and a height of 22 mm.

Example 7

90.9 g of hot-meltable silicone particles (3), 4.5 g of diphenylsiloxane having both molecular chain terminals blocked with dimethylhydrodienesiloxy group (the content of silicon-bonded hydrogen atoms=0.6 percent by mass) having a viscosity of 5 mPa·s as expressed by the average unit formula:

HMe$_2$SiO(Ph$_2$SiO)SiMe$_2$H 4.5 g of branched chain organopolysiloxane (the content of silicon-bonded hydrogen atoms=0.65 percent by mass) having two or more silicon-bonded hydrogen atoms in one molecule and a viscosity of 25 mPa·s as expressed by the average unit formula:

(Me$_3$SiO$_{3/2}$)$_{0.4}$(SiO$_{1/2}$)$_{0.6}$ (1.0 mol of silicon-bonded hydrogen atoms in the above-mentioned diphenylsiloxane and the above-mentioned organopolysiloxane with respect to 1 mol of vinyl group in the silicone particulates (3)), 286.4 g of alumina (AES-12 manufactured by Sumitomo Chemical Company, Limited) having an average primary particle diameter of 0.44 μm, and 13.6 g of fumed silica (AEROSIL50 manufactured by NIPPON AEROSIL CO., LTD) having an average particle diameter of 0.04 μm were collectively injected into a compact grinder, and stirred at room temperature (25° C.) for one minute to prepare uniform white curable particulate silicone composition. Next, the present composition was tableted by a tableting machine into cylindrical pellets having a diameter of 14 mm and a height of 22 mm.

Example 8

66.7 g of hot-meltable silicone particles (1), 33.3 g of methylphenylpolysiloxane having both molecular chain terminals blocked with dimethylvinylsiloxy group (the content of vinyl group=2.1 percent by mass) as expressed by the average unit formula:

ViMe$_2$SiO(MePhSiO)$_5$SiMe$_2$Vi, 1.7 g of 2,5-dimethyl-2,5-di(tert-butylperoxy)hexyne (whose half-life is 10 hours at 118° C.), 124.7 g of fused silica having an average particle diameter of 0.1 μm (EMIX-100 manufactured by TATSUMORI LTD.), and 20.0 g of fumed silica having an average particle diameter of 0.04 μm (AEROSIL50 manufactured by NIPPON AEROSIL CO., LTD.)

were collectively injected into a compact grinder, and stirred at room temperature (25° C.) for one minute to prepare uniform white curable particulate silicone composition. Next, the present composition was tableted by a tableting machine into cylindrical pellets having a diameter of 14 mm and a height of 22 mm.

Example 9

89.3 g of Hot-meltable silicone particles (2), 10.7 g of diphenylsiloxane having both molecular chain terminals blocked with dimethyl hydrodienesiloxy group (the content of silicon-bonded hydrogen atoms=0.6 percent by mass) having a viscosity of 5 mPa·s as expressed by the formula:

HMe$_2$SiO(Ph$_2$SiO)SiMe$_2$H, (1.0 mol of silicon-bonded hydrogen atoms in the above-mentioned diphenylsiloxane with respect to 1 mol of vinyl group in the silicone particulates (2)), 1-ethynyl-1-cyclohexanol (300 ppm in units of mass with respect to the present composition), 290.2 g of fused silica having an average particle diameter of 0.5 μm (SP507-05 manufactured by NIPPON STEEL Chemical & Material Co., Ltd.), and 13.4 g of fumed silica having an average particle diameter of 0.04 μm (AEROSIL50 manufactured by NIPPON AEROSIL CO., LTD)

were collectively injected into a compact grinder, and stirred at room temperature (25° C.) for one minute to prepare uniform white curable particulate silicone composition. Next, the present composition was tableted by a tableting machine into cylindrical pellets having a diameter of 14 mm and a height of 22 mm.

Comparative Example 1

89.3 g of hot-meltable silicone particles (1), 5.4 g of diphenylsiloxane having both molecular chain terminals blocked with dimethylhydrodienesiloxy group (the content of silicon-bonded hydrogen atoms=0.6 percent by mass) having a viscosity of 5 mPa·s as expressed by the formula:

HMe$_2$SiO(Ph$_2$SiO)SiMe$_2$H, 5.4 g of branched chain organopolysiloxane (the content of silicon-bonded hydrogen atoms=0.65 percent by mass) having two or more silicon-bonded hydrogen atoms in one molecule and a viscosity of 25 mPa·s, as expressed by the average unit formula:

(Me$_3$SiO$_{3/2}$)$_{0.4}$(SiO$_{1/2}$)$_{0.6}$ (1.0 mol of silicon-bonded hydrogen atoms in the above-mentioned diphenylsiloxane and the above-mentioned organopolysiloxane with respect to 1 mol of vinyl group in the silicone particulates (1)), 1-ethynyl-1-cyclohexanol (300 ppm in units of mass with respect to the present composition), and 401.8 g of spherical silica having an average particle diameter of 15 μm (HS-202 manufactured by NIPPON STEEL Chemical & Material Co., Ltd.)

were collectively injected into a compact grinder, and stirred at room temperature (25° C.) for one minute to prepare a uniform white curable particulate silicone composition. Next, the present composition was tableted by a tableting machine into cylindrical pellets having a diameter of 14 mm and a height of 22 mm.

Comparative Example 2

68.2 g of methylvinylphenylpolysiloxane as expressed by the average unit formula:

(MeViSiO$_{2/2}$)$_{0.25}$(Ph$_2$SiO$_{2/2}$)$_{0.30}$(PhSiO$_{3/2}$)$_{0.45}$(HO$_{1/2}$)$_{0.02}$, 9.1 g of dimethylvinylsiloxy endcapped polymethylphenylsiloxane as expressed by the formula:

ViMe$_2$SiO(MePhSiO)$_{17.5}$SiViMe$_2$ 22.7 g of 1,1,5,5-tetramethyl-3,3-diphenyltrisiloxane as expressed by the formula:

(HMe$_2$SiO)$_2$SiPh$_2$ (1.15 mol of silicon-bonded hydrogen atoms in the present component with respect to the total 1 mol of vinyl group in the above-mentioned methylvinylphenylpolysiloxane and dimethylvinylsiloxy endcapped polymethylphenylsiloxane), platinum 1,3-divinyl-1,1,3,3-tetramethyldisiloxane complex in 1,3-divinyl-1,1,3,3-tetramethyldisiloxane solution (5.0 ppm of platinum metal in units of mass with respect to the present composition), 1-ethynyl-1-cyclohexanol (300 ppm in units of mass with respect to the present composition), and 300.0 g of spherical silica having an average particle diameter of 15 μm (HS-202 manufactured by NIPPON STEEL Chemical & Material Co., Ltd.)

were mixed to prepare a paste-like curable silicone composition having a viscosity of 620 Pa·s at 25° C.

When heated at 120° C. for 10 minutes, the present hot-melting composition was a solid whose viscosity could not be measured at 25° C., and was fluidized at 100° C. or higher. When the present composition was fluidized at 100° C. or higher and then, heated at 150° C. for 10 minutes, the hot-melting properties were lost. The present composition was injected into a Teflon (registered trademark) tube having a diameter of 14 mm and then, heated at 120° C. for 10 minutes to produce a cylindrical pellet having a height of 22 mm.

Comparative Example 3

24.2 g of methylvinyl polysiloxane having both molecular chain terminals blocked with hydroxyl group having a straight chain methylvinylsiloxane block as expressed by the formula:

-(MeViSiO$_{2/2}$)$_6$—

22.5 g of dimethylpolysiloxane having both molecular chain terminals blocked with dimethylvinylsiloxy group as expressed by the formula:

Me$_2$ViSiO(Me$_2$SiO)$_{46}$SiMe$_2$Vi 400 g of spherical silica having an average particle diameter of 15 μm (HS-202 manufactured by NIPPON STEEL Chemical & Material Co., Ltd.)
11.0 g of n-octyltriethoxysilane, and
11.0 g of dimethylpolysiloxane having one molecular chain terminal blocked with trimethylsiloxy group and the other molecular chain terminal blocked with trimethoxysiloxy group having a viscosity of 125 mPa·s as expressed by the formula:

Me$_3$SiO(Me$_2$SiO)$_{110}$Si(OMe)$_3$ were injected into a ross mixer, and mixed at room temperature and then, kneaded under reduced pressures while being heated to prepare a silicone base.
Next, at room temperature, in the silicone base,
22.5 g methylhydrogen polysiloxane having both molecular chain terminals blocked with trimethylsiloxy group and having a straight chain methylhydrogensiloxane block as expressed by the formula:

-(MeHSiO$_{2/2}$)$_{50}$—

(1.5 mol of silicon-bonded hydrogen atoms in the present component with respect to the total 1 mol of methylvinylpolysiloxane in the silicone base and the vinyl group in dimethylpolysiloxane having both molecular chain terminals blocked with dimethylvinylsiloxy group),
5.5 g of a condensation reactant of dimethylsiloxane methylvinylsiloxane copolymer having both molecular chain terminals blocked with hydroxyl group having a viscosity of 20 mPa·s and 3-glycidoxypropyl trimethoxysilane with a mass ratio of 1:2, and
1-ethynyl-1-cyclohexanol (200 ppm in units of mass with respect to the present composition)
were mixed, and then, platinum 1,3-divinyl-1,1,3,3-tetramethyl disiloxane in 1,3-divinyl-1,1,3,3-tetramethyldisiloxane solution (3 ppm of platinum atoms in units of mass with respect to the present composition) was mixed thereto to prepare a paste-like curable silicone composition having a viscosity of 340 Pa·s at 25° C.

Comparative Example 4

55.2 g of methylvinylphenylpolysiloxane as expressed by the average unit formula:

(MeViSiO$_{2/2}$)$_{0.15}$(Me$_2$SiO$_{2/2}$)$_{0.15}$(Ph$_2$SiO$_{2/2}$)$_{0.30}$(PhSiO$_{3/2}$)$_{0.40}$(HO$_{1/2}$)$_{0.04}$ 13.8 g of 1,3,5,7-tetramethyl-1,3,5,7-tetravinyl cyclotetrasiloxane as expressed by the formula:

(MeViSiO)$_4$ 30.9 g of 1,1,5,5-tetramethyl-3,3-diphenyltrisiloxane as expressed by the formula:

(HMe$_2$SiO)$_2$SiPh$_2$ (0.9 mol of silicon-bonded hydrogen atoms in the present component with respect to the total 1 mol of vinyl group in the above-mentioned methylvinylphenylpolysiloxane and 1,3,5,7-tetramethyl-1,3,5,7-tetravinyl cyclotetrasiloxane),
platinum 1,3-divinyl-1,1,3,3-tetramethyl disiloxane in 1,3-divinyl-1,1,3,3-tetramethyl disiloxane solution (3.5 ppm of platinum metal in units of mass with respect to the present composition), 1-ethynyl-1-cyclohexanol (200 ppm in units of mass with respect to the present composition), and
400.0 g of spherical silica (HS-202 manufactured by NIPPON STEEL Chemical & Material Co., Ltd) having an average particle diameter of 15 μm
were mixed to prepare a paste-like curable silicone composition having a viscosity of 104 Pa·s.

TABLE 1

| Experiment Example No. | Example 1 | Example 2 | Example 3 | Example 4 | Example 5 |
|---|---|---|---|---|---|
| Properties of Curable Particulate Silicone Composition | | | | | |
| Softening Point (° C.) | 60 | 60 | 60 | 50 | 80 |
| Melting Viscosity (Pa · s) | 3480 | 1830 | 2660 | 4490 | 1480 |
| Moldability | Favorable | Favorable | Favorable | Favorable | Favorable |
| Properties of Cured Product | | | | | |
| Storage Modulus @25° C. (Mpa) | 1880 | 1220 | 440 | 1040 | 1920 |
| Storage Modulus @150° C. (Mpa) | 89 | 74 | 31 | 46 | 95 |
| Flexural Elongation Rate (%) | 2.8 | 4.4 | 7.5 | 5.3 | 3.1 |
| Molded Product Warpage (mm) | <1 | <1 | <1 | <1 | <1 |
| Experiment Example No. | Example 6 | Example 7 | Example 8 | Example 9 | |
| Properties of Curable Particulate Silicone Composition | | | | | |
| Softening Point (° C.) | 60 | 50 | 60 | 60 | |
| Melting Viscosity (Pa ·) | 1610 | 2990 | 2870 | 3990 | |
| Moldability | Favorable | Favorable | Favorable | Favorable | |

TABLE 1-continued

| Hardness of Cured Product | | | | |
|---|---|---|---|---|
| Storage Modulus @25° C. (Mpa) | 330 | 830 | 690 | 1960 |
| Storage Modulus @150° C. (Mpa) | 24 | 33 | 39 | 92 |
| Flexural Elongation Rate (%) | 8.8 | 7.1 | 8.4 | 1.5 |
| Molded Product Warpage (mm) | <1 | <1 | <1 | <1 |

TABLE 2

| Experiment Example No. | Comparative Example 1 | Comparative Example 2 | Comparative Example 3 | Comparative Example 4 |
|---|---|---|---|---|
| Properties of Curable Particulate Silicone Composition | | | | |
| Softening Point (° C.) | 65 | 55 | N/A | N/A |
| Melting Viscosity (Pa · s) | 2620 | 850 | N/A | N/A |
| Moldability | Favorable | Favorable | Crack | Peeling |
| Properties of Cured Product | | | | |
| Storage Modulus @25° C. (Mpa) | 5620 | 3890 | 2280 | 2140 |
| Storage Modulus @150° C. (Mpa) | 430 | 74 | 1280 | 380 |
| Flexural Elongation Rate (%) | 0.8 | 2.1 | 0.7 | 1.8 |
| Molded Product Warpage (mm) | 3 | <1 | 5 | 3 |

The invention claimed is:

1. A curable particulate silicone composition comprising:
  (A) a hot-meltable silicone particle that has a softening point of 30° C. or higher and has a hydrosilylatable group and/or a radical reactive group;
  (B) an inorganic filler that is substantially free of coarse particles having an average particle diameter of 10.0 µm or larger; and
  (C) a curing agent;
  wherein component (B) contains an inorganic filler (b1) that is fumed silica (b1-1) and having an average particle diameter of 0.1 µm or lower, and an inorganic filler (b2) having an average particle diameter of 0.1 to 5.0 µm at a mass ratio of 1/99 to 50/50; and
  wherein when cured, the curable particulate silicone composition provides a cured product having a storage modulus (G') of 2000 Mpa or lower at 25° C. and of 100 Mpa or lower at 150° C.

2. The curable particulate silicone composition according to claim 1, wherein component (B) is a filler that has no softening point or does not soften at the softening point of component (A) or lower.

3. The curable particulate silicone composition according to claim 1, wherein component (B) is an inorganic filler that is substantially free of coarse particles having an average particle diameter of 5.0 µm or larger.

4. The curable particulate silicone composition according to claim 1, wherein component (B) is selected from the group consisting of a reinforcing filler, a white pigment, a thermal conductive filler, an electrical conductive filler, a phosphor, and mixtures thereof.

5. The curable particulate silicone composition according to claim 1, wherein component (b2) is fused silica (b2-1).

6. The curable particulate silicone composition according to claim 1, wherein component (A) is selected from the group consisting of a silicone particulate composed of resinoid organopolysiloxane ($A_1$), an organopolysiloxane cross-linked product ($A_2$) formed by partially cross-linking at least one organopolysiloxane, a block copolymer ($A_3$) consisting of a resinoid organosiloxane block and a chain organosiloxane block, and mixtures thereof.

7. The curable particulate silicone composition according to claim 1, wherein component (A) is a completely-spherical silicone particulate having an average primary particle diameter of 1 to 10 µm, and 10 mol % or higher of a silicon-bonded organic group in component (A) is an aryl group.

8. The curable particulate silicone composition according to claim 1, wherein the content of component (B) is 10 to 2000 parts by mass with respect to 100 parts by mass of component (A).

9. The curable particulate silicone composition according to claim 1, wherein the curable particulate silicone composition is in the form of pellet or sheet.

10. A method of molding a cured product, the method comprising:
  (I) heating the curable particulate silicone composition according to claim 1 to the softening point of component (A) or higher to melt the curable particulate silicone composition;
  (II) injecting the curable silicone composition acquired in step (I) into a mold or spreading the curable silicone composition acquired in step (I) in a mold by clamping; and
  (III) curing the curable silicone composition injected or spread in step (II).

11. The method of molding according to claim 10, further comprising simultaneously overmolding and underfilling of a semiconductor element with the curable particulate silicone composition.

12. The method of molding according to claim 10, further comprising coating the surface of a semiconductor wafer substrate that mounts one or more semiconductor elements with the curable particulate silicone composition, and performing overmolding so as to fill a gap between the semiconductor elements.

* * * * *